(12) United States Patent
Nendai et al.

(10) Patent No.: US 10,109,691 B2
(45) Date of Patent: Oct. 23, 2018

(54) METHOD FOR MANUFACTURING ORGANIC EL DISPLAY PANEL

(71) Applicant: JOLED INC., Tokyo (JP)

(72) Inventors: Kenichi Nendai, Tokyo (JP); Nobuto Hosono, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/320,305

(22) PCT Filed: Jun. 24, 2015

(86) PCT No.: PCT/JP2015/003184
§ 371 (c)(1),
(2) Date: Dec. 19, 2016

(87) PCT Pub. No.: WO2015/198603
PCT Pub. Date: Dec. 30, 2015

(65) Prior Publication Data

US 2017/0162638 A1   Jun. 8, 2017

(30) Foreign Application Priority Data

Jun. 25, 2014   (JP) ................................. 2014-130432

(51) Int. Cl.
*H01L 51/40* (2006.01)
*H01L 27/32* (2006.01)
(Continued)

(52) U.S. Cl.
CPC ........ *H01L 27/3246* (2013.01); *H01L 27/322* (2013.01); *H01L 51/0004* (2013.01); *H01L 51/56* (2013.01); *H01L 2227/323* (2013.01)

(58) Field of Classification Search
CPC ............. H01L 27/3283; H01L 27/3246; H01L 51/004; H01L 51/0005; H01L 51/56; H01L 2227/323
(Continued)

(56) References Cited

U.S. PATENT DOCUMENTS 5,443,922 A   8/1995 Nishizaki et al.
6,518,700 B1 *  2/2003 Friend ................ H01L 51/5284
                                                     313/501
(Continued)

FOREIGN PATENT DOCUMENTS

JP        5-163488 A     6/1993
JP      2002-22933 A     1/2002
(Continued)

OTHER PUBLICATIONS

International Search Report in International Patent Application No. PCT/JP2015/003184, dated Sep. 29, 2015.

*Primary Examiner* — Brook Kebede
(74) *Attorney, Agent, or Firm* — Hauptman Ham, LLP

(57) ABSTRACT

An organic EL display panel manufacturing method including: preparing a substrate; forming at least first electrodes on the substrate; forming, by performing photolithography on the substrate having the first electrodes, a bank layer made of a photoresist and having apertures corresponding one-to-one with the first electrodes; forming a functional layer in each of the apertures by applying an ink containing a functional material to the aperture and drying the applied ink; and forming at least a second electrode on the functional layer. The forming of the bank layer includes: applying the photoresist to the substrate having the first electrodes; forming apertures corresponding one-to-one with the first electrodes in the photoresist by performing exposure using a mask and then developing the photoresist; after forming the apertures, performing exposure of the photoresist having the (Continued)

apertures; after performing the exposure of the photoresist having the apertures, baking the photoresist.

4 Claims, 15 Drawing Sheets

(51) Int. Cl.
*H01L 51/00* (2006.01)
*H01L 51/56* (2006.01)

(58) Field of Classification Search
USPC .......................................................... 438/99
See application file for complete search history.

(56) References Cited

U.S. PATENT DOCUMENTS

2005/0139582 A1* 6/2005 Tanaka ............... B23K 26/0648
219/121.75
2005/0157157 A1* 7/2005 Tsukamoto ............ B41M 5/265
347/213
2010/0181559 A1 7/2010 Nakatani et al.
2011/0018007 A1* 1/2011 Kasahara ............ H01L 27/3246
257/88
2013/0001594 A1* 1/2013 Crankshaw ......... H01L 27/3246
257/79
2013/0126844 A1 5/2013 Nishiyama

FOREIGN PATENT DOCUMENTS

| | | |
|---|---|---|
| JP | 2002-207114 A | 7/2002 |
| JP | 2008-287251 A | 11/2008 |
| JP | 2011-165396 A | 8/2011 |
| JP | 2013-186450 A | 9/2013 |
| JP | 2013-191483 A | 9/2013 |
| JP | 2014-75260 A | 4/2014 |
| WO | 2009/147838 A1 | 12/2009 |
| WO | 2012/017491 A1 | 2/2012 |
| WO | 2012/147626 A1 | 11/2012 |

* cited by examiner

| | Photograph after application | Unwetting |
|---|---|---|
| Implementation sample 21 UV 0 sec | | No |
| Implementation sample 22 UV 120 sec | | No |
| Implementation sample 23 UV 220 sec | | No |
| Comparative sample 21 UV 0 sec | | Yes |
| Comparative sample 22 UV 120 sec | | Yes |
| Comparative sample 23 UV 220 sec | | No |

FIG. 11

| | Photograph after application | Unwetting |
|---|---|---|
| Implementation sample 24 UV 0 sec | | Yes |
| Implementation sample 25 UV 120 sec | | No |
| Implementation sample 26 UV 220 sec | | No |
| Comparative sample 24 UV 0 sec | | Yes |
| Comparative sample 25 UV 120 sec | | Yes |
| Comparative sample 26 UV 220 sec | | Yes |

METHOD FOR MANUFACTURING ORGANIC EL DISPLAY PANEL

RELATED APPLICATIONS

The present application is a National Phase of International Application Number PCT/JP2015/003184, filed on Jun. 24, 2015, which claims priority to Japanese Patent Application Number 2014-130432, filed on Jun. 25, 2014.

TECHNICAL FIELD

The present invention is related to manufacturing methods of organic EL display panels. In particular, the present invention is related to a method of forming a bank layer of an organic EL display panel.

BACKGROUND ART

In recent years, research and development are underway of upsizing of organic electroluminescence (EL) display panels, which are display panels making use of light-emission of organic EL elements. Typically, an organic EL display panel has an array of organic EL elements disposed above a support substrate, and displays an image by the organic EL elements (pixels) emitting light. A typical organic EL element includes a pair of electrodes, and a functional layer containing functional material, such as an organic light-emitting layer containing organic light-emitting material, disposed between the electrodes. Meanwhile, in manufacturing a full-color compatible organic EL display panel, separate application of three different organic light-emitting materials, each emitting a different one of the colors red, green, and blue, is now typically carried out. This is advantageous in terms of luminous efficacy, light-emission lifetime, color representation, and the like. Further, there are functional layers other than organic light-emitting layers, which include hole injection layers, electron injection layers, hole transport layers, electron transport layers, hole blocking layers, electron blocking layers, and buffer layers. The function of a given functional layer in an organic EL element is dependent upon the functional material contained in the functional layer and the position of the functional layer in the organic EL element.

Typically, methods used in forming functional layers are largely divided into dry processes and wet processes. One example of a dry process is vacuum vapor deposition, and one example of a wet process is inkjet printing. A wet process typically involves the application of ink containing functional material, and the drying of the ink. Wet processes are considered as being more suitable than dry processes for large-sized organic EL display panels manufactured through separate application of three different organic light-emitting materials each corresponding to a different color, for achieving accurate forming of functional layers, efficient material use, and the like.

When employing a wet process, a bank layer defining apertures is formed on a substrate to prevent ink outflow from predetermined ink application positions, and ink is applied to each of such apertures. Typically, a bank layer is made of a photoresist, and is formed through photolithography. Specifically, the forming of a bank layer involves, for example, application of a photoresist onto a substrate, exposure using a mask (referred to in the following as masked exposure), developing, and baking of the photoresist (refer to Patent Literatures 1, 2, and 3, for example).

Among such processes, baking of developed photoresist is performed to provide a bank layer with resistance against organic solvents, and thereby prevents deterioration of the bank layer due to contact with ink used in the wet process (refer to Patent Literature 1 for example). In addition, the baking, when performed in the forming of a bank layer containing a liquid repellent component, causes movement of the liquid repellent component to the bank layer surface, and thus increases the liquid repellency of the bank layer surface (refer to Patent Literature 2, for example).

CITATION LIST

Patent Literature

[Patent Literature 1]
  Japanese Patent Application Publication No. 2013-191483
[Patent Literature 2]
  Japanese Patent Application Publication No. 2014-75260
[Patent Literature 3]
  Japanese Patent Application Publication No. 2008-287251

SUMMARY OF INVENTION

Technical Problem

However, when baking a photoresist that has undergone masked exposure and developing and thus has apertures formed therein, a flow of photoresist towards the inside of the apertures occurs (in the following, this phenomenon is referred to as the "heat-caused loosening" of photoresist). Consequently, photoresist portions around the apertures are provided with the shapes of slope portions with small inclination angles.

Here, it should be noted that apertures defined by slope portions with small inclination angles expose a smaller area than apertures defined by slope portions with great inclination angles. This results in the resultant organic EL display panel having a small aperture ratio. Further, slope portions with small inclination angles consequently formed in the bank layer become obstacles during the flow of ink of functional material, and thus, result in a functional layer formed in the bank layer apertures having problems such as unevenness in film thickness and undesirable shape. Thus, in the manufacturing of an organic EL display panel, it is desirable that heat-caused loosening of photoresist be suppressed to prevent slope portions with small inclination angles from being formed in the bank layer.

In view of this, the present invention aims to provide an organic EL display panel manufacturing method that suppresses the occurrence of heat-caused loosening of photoresist during the forming of a bank layer.

Solution to Problem

One aspect of the present invention is a manufacturing method of an organic electroluminescence (EL) display panel, including: preparing a substrate; forming at least first electrodes on the substrate; forming, by performing photolithography on the substrate having the first electrodes formed thereon, a bank layer that is made of a photoresist and that has apertures corresponding one-to-one with the first electrodes; forming a functional layer in each of the apertures by applying an ink containing a functional material to the aperture and drying the applied ink; and forming at least a second electrode on the functional layer. In the manufacturing method, the forming of the bank layer includes: applying the photoresist to the substrate having the first electrodes formed thereon; forming apertures corresponding one-to-one with the first electrodes in the photoresist by performing exposure of the photoresist using a mask and then developing the photoresist; after forming the apertures in the photoresist, performing exposure of the photoresist having the apertures formed therein; after performing the exposure of the photoresist having the apertures formed therein, performing baking of the photoresist.

Advantageous Effects of Invention

In the manufacturing method pertaining to one aspect of the present invention, portions of the photoresist around the apertures first become incompletely-exposed areas through the masked exposure, and then are further exposed through the photoresist exposure performed after the developing. As such, in the subsequent baking of the photoresist, the flow of photoresist towards inside of the apertures is smaller compared to when the photoresist exposure after the developing is not performed. Accordingly, the manufacturing method pertaining to one aspect of the present invention suppresses heat-caused loosening of photoresist occurring during the forming of the bank layer.

BRIEF DESCRIPTION OF DRAWINGS

FIG. 9 shows cross-sectional photographs illustrating a change in bank layer shape before and after baking, for different exposure amounts in the supplementary photoresist exposure.

FIG. 10 shows plan-view photographs of surfaces having different levels of ink wettability.

FIG. 11 shows plan-view photographs of surfaces having different levels of ink wettability.

DESCRIPTION OF EMBODIMENT(S)

Figure 1:
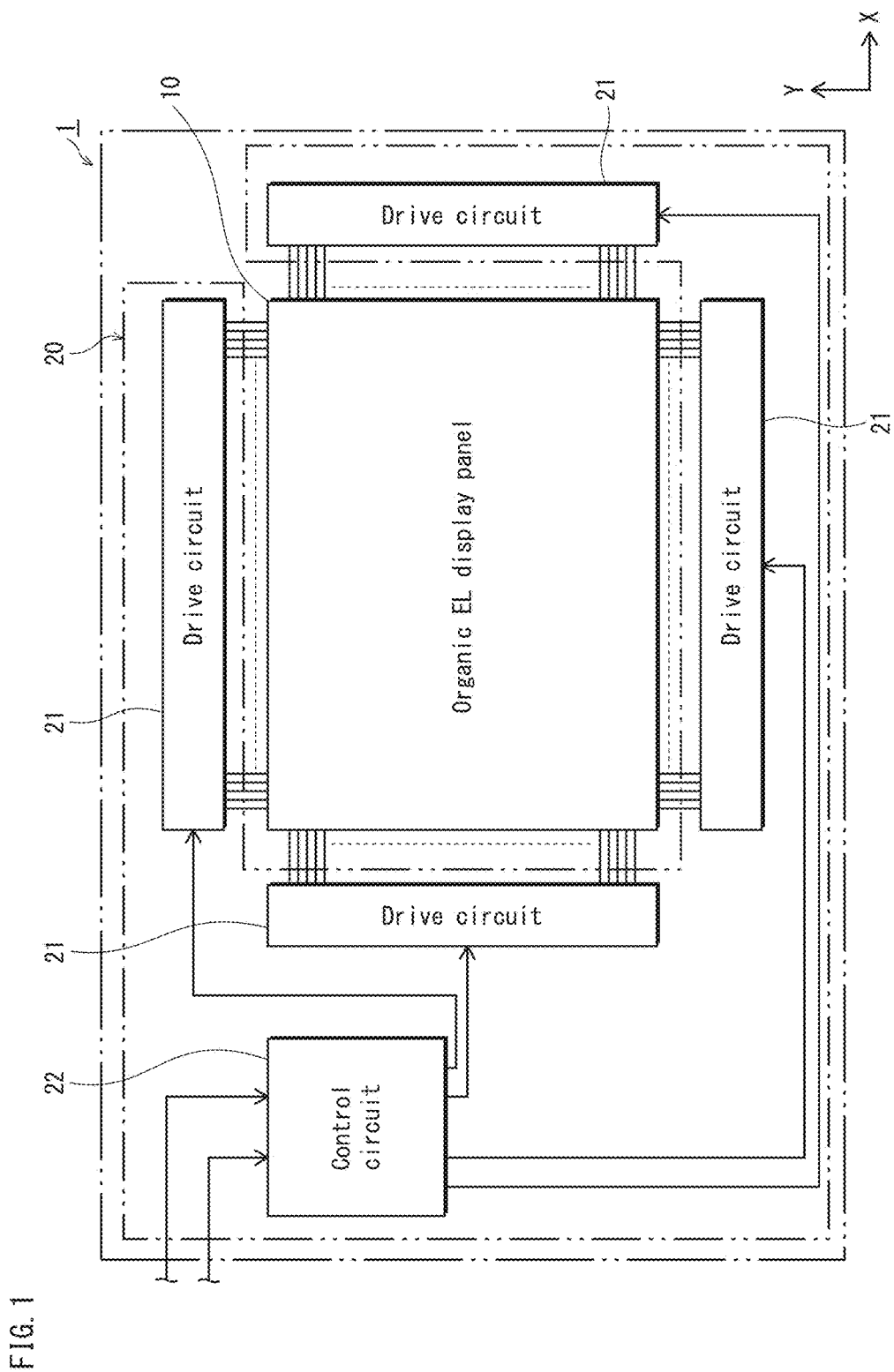
FIG. 1 is a block diagram illustrating the overall structure of an organic EL display device 1.

<Process Leading to Aspect of Present Invention>

FIGS. 13A through 13C and FIGS. 14A through 14C are schematic cross-sectional views illustrating the forming of a bank layer of an organic EL display panel. Specifically, FIGS. 13A through 13C and FIGS. 14A through 14C illustrate procedures involved in forming, through photolithography, a bank layer 95 on a substrate 11 having first electrodes 12, hole injection layers 13, and a pixel defining layer 14 formed thereon. The forming of the bank layer 95 includes application, masked exposure, developing, baking, and exposure to UV radiation performed in the state order.

Figure 13A:
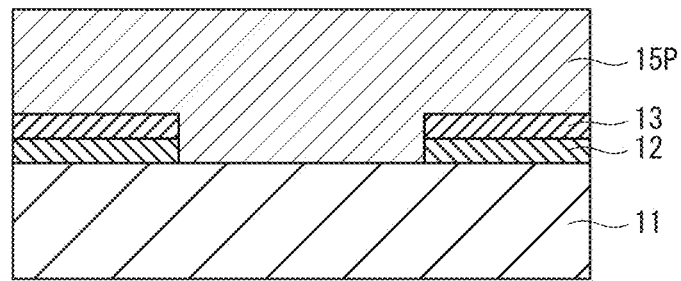
FIGS. 13A through 13C are schematic cross-sectional views illustrating procedures in the forming of a bank layer of an organic EL display panel, with FIG. 13A illustrating application of photoresist, FIG. 13B illustrating masked exposure of negative photoresist, and FIG. 13C illustrating developing.

First, a photoresist 15P is applied to the substrate 11 having the first electrodes 12, the hole injection layers 13, and the pixel defining layers 14 formed thereon, as illustrated in FIG. 13A. Here, description is provided assuming that the photoresist 15P is a negative photoresist, and thus, the photoresist 15P becomes less soluble to a developer after exposure.

Figure 13B:
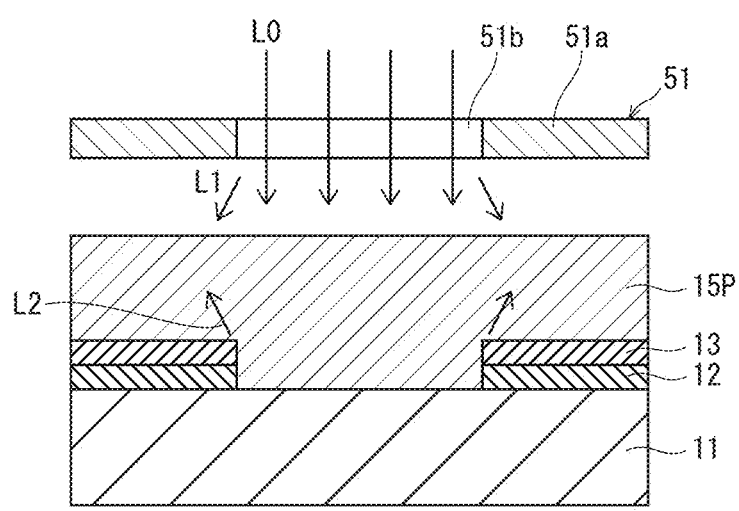

Subsequently, with a photomask 51 placed over the substrate 11, exposure of the photoresist 15P is performed by irradiating the substrate 11 with light L0 from over the photomask 51 (i.e., masked exposure of the photoresist 15P is performed), as illustrated in FIG. 13B. The photomask 51 has light blocking portions 51a that block the light L0 and light transmitting portions 51b that allow the light L0 to pass through. Due to the photomask 51 being placed over the substrate 11, only light L0 passing through the light transmitting portions 51b reaches the photoresist 15P. As such, only the portions of the photoresist 15P below the light transmitting portions 51b are exposed to the light L0, and thus, the exposed portions become less soluble to a developer.

Here, it should be noted that the portions of the photoresist 15P that receive light do not match exactly with the arrangement pattern of the light transmitting portions 51b of the photomask 51. That is, in addition to portions of the photoresist 15P directly below the light transmitting portions 51b, portions around such portions also receive light. Specifically, parts of the light L0 that pass through edge portions of light transmitting portions 51b become diffracted light L1 traveling away from the light transmitting portions 51b, i.e., traveling towards the light blocking portions 51a. Further, parts of the light L0 that pass through the photoresist 15P and undergo scattered reflection below the photoresist 15P (at, for example, a first electrode 12, etc.) become reflected light L2 traveling away from the light transmitting portions 51b, i.e., traveling towards the light blocking portions 51a. The generation of the diffracted light L1 and the reflected light L2 results in portions around the portions of the photoresist 15P directly below the light transmitting portions 51b also receiving light.

Here, it should be noted that the portions of the photoresist 15P around the portions directly below the light transmitting portions 51b receive a smaller amount of light than the portions directly below the light transmitting portions 51b, due to the diffracted light L1 and the reflected light L2 having lower intensity than light L0 passing straightly through the light transmitting portions 51b. This results in the masked exposure producing, in the photoresist 15P, exposed areas 15Pa directly below the light transmitting portions 51b and incompletely-exposed areas 15Pb that are areas around the exposed areas 15Pa and that have received a smaller amount of light than the exposed areas 15Pa. Here, it should be noted that while the incompletely-exposed areas 15Pb, similar to the exposed areas 15Pa, have become less soluble to a developer compared to before the exposure, the stiffness of the incompletely-exposed areas 15Pb is lower than the stiffness of the exposed areas 15Pa.

Figure 13C:
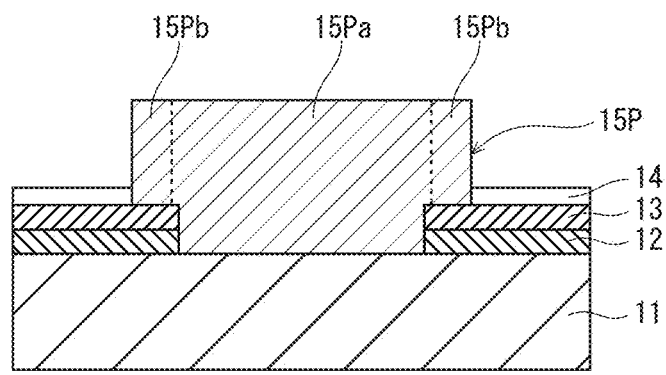

Subsequently, developing is performed as illustrated in FIG. 13C. In the developing, since the photoresist 15P is a negative photoresist, the exposed areas 15Pa and the incompletely-exposed areas 15Pb remain on the substrate 11 whereas portions of the photoresist 15P not having received light dissolve to the developer and are removed. This results in apertures being formed in the photoresist 15P. The apertures expose the hole injection layers 13 and the pixel defining layer 14. Note that FIG. 13C illustrates a surface of the pixel defining layer 14 without any hatching. Hatching is not provided to the surface of the pixel defining layer 14 since the surface is not included in the cross-section shown in FIG. 13C, and rather, is included in a cross-section located behind the cross-section shown in FIG. 13C. (This similarly applies to FIGS. 14A and 14B).

Figure 14A:
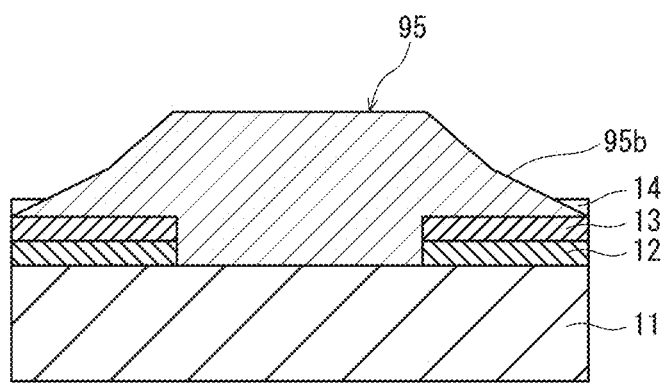
FIGS. 14A through 14C are schematic cross-sectional views illustrating procedures in the forming of a bank layer of an organic EL display panel, with FIG. 14A illustrating baking, FIG. 14B illustrating exposure to UV radiation, and FIG. 14C illustrating masked exposure of positive photoresist.

Subsequently, baking of the photoresist 15P is performed as illustrated in FIG. 14A. This baking makes the incompletely-exposed areas 15Pb, whose stiffness is lower than that of the exposed areas 15Pa, highly flowable, and results in a great flow of the incompletely-exposed areas 15Pb towards the inside of the apertures (i.e., heat-caused loosening of the photoresist 15P occurs). Thus, the bank layer 95 that is formed has slope portions 95b with small inclination angles around the apertures. Here, an inclination angle of a slope portion is an angle between the slope portion and the top surface of the substrate, and thus a slope portion with a 0° inclination angle is parallel to the substrate top surface and a slope portion with a 90° inclination angle is perpendicular to the substrate top surface.

The slope portions 95b, due to having small inclination angles, define apertures exposing small areas of the top surfaces of the hole injection layers 13. Thus, the slope portions 95b result in the organic EL display panel having a small aperture ratio and thus pixels with low definition. Further, the slope portions 95b become obstacles during the flow of ink of functional material applied to the apertures, and thus, result in a functional layer formed in the apertures through a wet process having problems such as unevenness in film thickness and undesirable shape. In particular, since surfaces of the bank layer 95 are typically provided with liquid repellency when functional layer forming is to be performed through a wet process, the slope portions 95b greatly affect ink wettability. In view of this, it is preferable that slope portions of a bank layer have as great an inclination angle as possible (i.e., an inclination angle as close to 90° as possible).

Figure 14B:
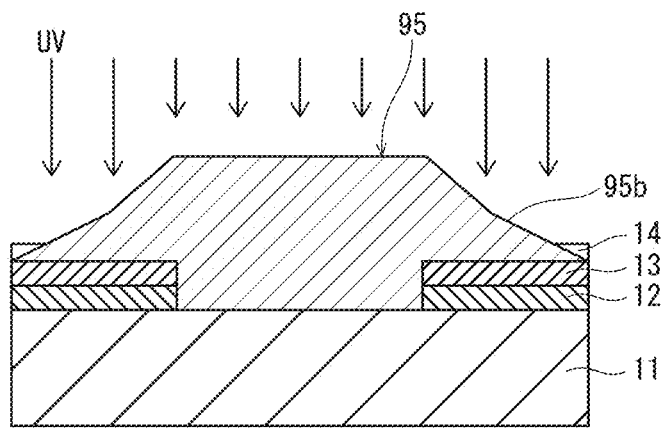

Meanwhile, in typical photolithography for forming the bank layer 95, a top side of the substrate 11 having been baked is exposed to UV radiation, as illustrated in FIG. 14B. Here, the slope portions 95b can be decomposed and removed to a sufficient extent by performing the exposure to UV radiation with a great exposure amount greater than typically used. Removal of the slope portions 95b results in the apertures in the bank layer 95 exposing greater areas of the top surfaces of the hole injection layers 13 than before the UV radiation. Thus, exposure to UV radiation with a great exposure amount may be performed to improve the wettability inside the apertures.

However, performing UV radiation at a great exposure amount as described above results in a considerable amount of the portions of the bank layer 95 other than the slope portions 95b undergoing decomposition and removal along with the slope portions 95b. This results in a decrease in film thickness, liquid repellency, etc., of the portions of the bank layer 95 other than the slope portions 95b. Further, while such decrease in film thickness, liquid repellency, etc., of photoresist portions corresponding to bank layer portions does not bring about much problem in typical photolithography where the photoresist portions are used to prevent the spread of etchants and for removal (lift-off) of portions of layers over the bank layer, the decrease in film thickness, liquid repellency, etc., of the bank layer itself is problematic when manufacturing an organic EL display panel by using a wet process. This is since, with a bank layer having problems such as reduced thickness and reduced liquid repellency, ink applied in the wet process may flow over the bank layer into adjacent apertures. This flow of ink over the bank layer results in the forming of a functional layer having problems such as unevenness in film thickness and undesirable shape. In particular, when separate application of three different organic light-emitting materials each corresponding to a different color as described above is performed, the flow of ink over the bank layer results in the mixing of inks of different colors, and thus light-emission color failure of pixels. As such, when manufacturing an organic EL display panel through such methods, it is inappropriate to attempt to remove slope portions 95b, which are slope portions with small inclination angles, to a sufficient extent by increasing the exposure amount in UV radiation. Thus, there is a demand for a method ensuring that slope portions have great inclination angles upon completion of the baking, and thus, a method where the provision of the slope portions with great inclination angles is achieved without relying upon post-processing such as exposure to UV radiation. That is, it is preferable to suppress the occurrence of heat-caused loosening during the forming of the bank layer.

Figure 14C:
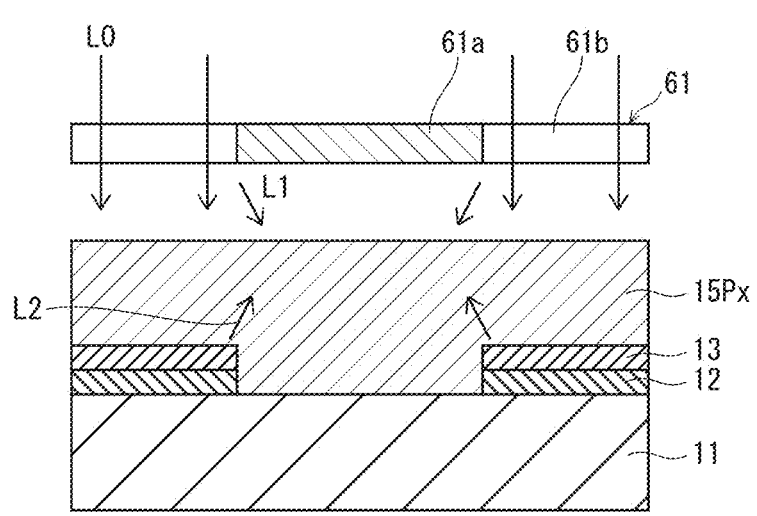

Meanwhile, it should be noted that incompletely-exposed areas that bring about heat-caused loosening as described above are not only formed with negative photoresist. That is, such incompletely-exposed areas are also formed with positive photoresist. FIG. 14C illustrates a process of performing exposure of a photoresist 15Px by using a photomask 61 having light blocking portions 61a and light transmitting portions 61b arranged in a pattern. Here, the photoresist 15Px is a positive photoresist. Thus, with the photoresist 15Px, the portions of the photoresist 15Px that are below the light transmitting portions 61b and thus are exposed to light L0 become more soluble to a developer.

In the masked exposure, parts of the light L0 that pass through edge portions of the light transmitting portions 61b become diffracted light L1 traveling away from the light transmitting portions 61b, i.e., traveling towards the light blocking portions 61a. Further, parts of the light L0 that pass through the photoresist 15Px and undergo scattered reflection below the photoresist 15Pd becomes reflected light L2 traveling away from the light transmitting portions 61b, i.e., traveling towards the light blocking portions 61a. Thus, the masked exposure produces, in the photoresist 15Px, incompletely-exposed areas around areas (exposed areas) directly below the light transmitting portions 61b. This is similar to when the photoresist 15P, which is a negative photoresist, is used in the masked exposure.

Here, it should be noted that while the incompletely-exposed areas formed in the photoresist 15Px, similar to areas of the photoresist 15Px not exposed to light, remain not much soluble to a developer, the stiffness of the incompletely-exposed areas 15Pb becomes lower than that of the non-exposed areas through the masked exposure. Thus, slope portions with small inclination angles are formed around the apertures when using the photoresist 15Px, which is a positive photoresist, similar to when using a negative photoresist. That is, it is preferable to suppress the occurrence of heat-caused loosening during the forming of the bank layer when using the photoresist 15Px, which is a positive photoresist, similar to when using a negative photoresist.

Figure 15A:
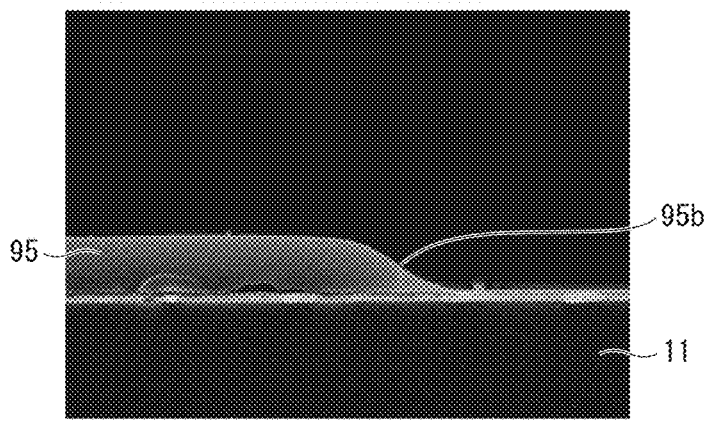
FIG. 15A is a cross-sectional photograph illustrating slope portions of photoresist baked after exposure at an exposure amount of 200 mJ/cm$^2$.
Figure 15B:
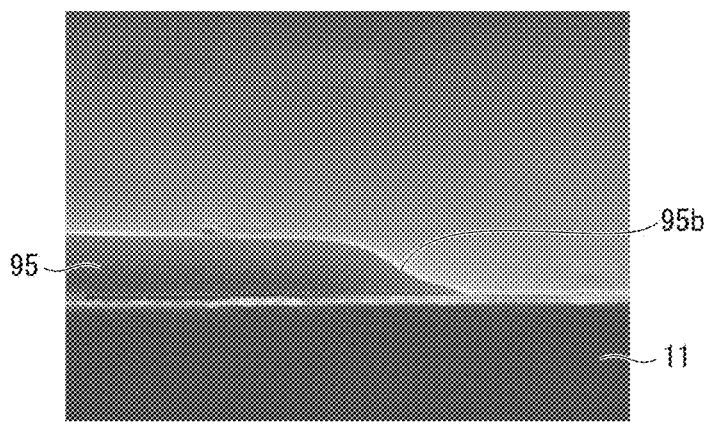
FIG. 15B is a cross-sectional photograph illustrating slope portions of photoresist baked after exposure at an exposure amount of 300 mJ/cm$^2$.
Figure 15C:
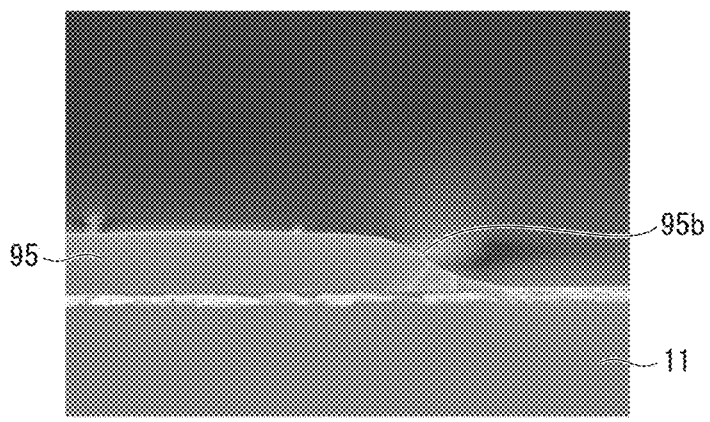
FIG. 15C is a cross-sectional photograph illustrating slope portions of photoresist baked after exposure at an exposure amount of 400 mJ/cm$^2$.

Here, one possible measure for preventing the occurrence of heat-caused loosening is increasing the exposure amount in masked exposure. In connection with this, FIG. 15A is a cross-sectional photograph illustrating slope portions of photoresist baked after masked exposure at an exposure amount of 200 mJ/cm$^2$, FIG. 15B is a cross-sectional photograph illustrating slope portions of photoresist baked after masked exposure at an exposure amount of 300 mJ/cm$^2$, and FIG. 15C is a cross-sectional photograph illustrating slope portions of photoresist baked after masked exposure at an exposure amount of 400 mJ/cm$^2$. FIGS. 15A through 15C show that increasing the exposure amount does not bring about much change in the inclination angles of the baked slope portions 95b, and also show that heat-caused loosening occurs even when the exposure amount is increased. The following describes the reason why increasing the exposure amount in the masked exposure is not an effective measure for preventing the occurrence of heat-caused loosening.

Referring to the example illustrated in FIG. 13B, increasing the exposure amount increases the light amount of the diffracted light L1 and the reflected light L2, which results in the incompletely-exposed areas 15Pb around the exposed areas 15Pa being provided with higher stiffness through the masked exposure compared to when the exposure amount is not increased. However, at the same time, the diffracted light L1 and the reflected light L2, due to having increased light amounts, also reach areas of the photoresist 15P around (towards light blocking portions 51a) the incompletely-exposed areas 15Pb. Thus, additional incompletely-exposed areas 15Pb are formed outside the incompletely-exposed areas 15Pb having increased stiffness as described above. The additional incompletely-exposed areas 15Pb have lower stiffness than the incompletely-exposed areas 15Pb. As such, not only is the increasing of the exposure amount not effective in suppressing heat-caused loosening, the increasing of the exposure amount leads to a spread of the incompletely-exposed areas 15Pb and thus an increase in area of the slope portions 95b. Thus, the increasing of the exposure amount actually brings about a decrease in aperture ratio, and increases the risk of a functional layer that is formed having problems such as unevenness in film thickness and undesirable shape.

In view of the above, the inventors of the present invention conceived the aspects of the present invention that are described in the following in an effort to suppress heat-caused loosening during the forming of a bank layer.

<Overview of Aspects of Present Invention>

One aspect of the present invention is a manufacturing method of an organic electroluminescence (EL) display panel, including: preparing a substrate; forming at least first electrodes on the substrate; forming, by performing photolithography on the substrate having the first electrodes formed thereon, a bank layer that is made of a photoresist and that has apertures corresponding one-to-one with the first electrodes; forming a functional layer in each of the apertures by applying an ink containing a functional material to the aperture and drying the applied ink; and forming at least a second electrode on the functional layer. In the manufacturing method, the forming of the bank layer includes: applying the photoresist to the substrate having the first electrodes formed thereon; forming apertures corresponding one-to-one with the first electrodes in the photoresist by performing exposure of the photoresist using a mask and then developing the photoresist; after forming the apertures in the photoresist, performing exposure of the photoresist having the apertures formed therein; after performing the exposure of the photoresist having the apertures formed therein, performing baking of the photoresist.

In the manufacturing method pertaining to one aspect of the present invention, portions of the photoresist around the apertures first become incompletely-exposed areas through the masked exposure, and then are further exposed through the photoresist exposure performed after the developing. As such, in the subsequent baking of the photoresist, the flow of the photoresist towards the inside of the apertures is smaller compared to when the photoresist exposure after the developing is not performed. Accordingly, the manufacturing method pertaining to one aspect of the present invention suppresses heat-caused loosening of photoresist occurring during the forming of the bank layer.

Another aspect of the present invention is the manufacturing method pertaining to an above-described aspect wherein the photoresist contains a liquid repellent component.

Another aspect of the present invention is the manufacturing method pertaining to an above-described aspect wherein the liquid repellent component is a fluorine compound or a siloxane compound.

Another aspect of the present invention is the manufacturing method pertaining to an above-described aspect wherein the forming of the bank layer further includes performing a surface treatment on the photoresist to provide the photoresist with liquid repellency.

Another aspect of the present invention is the manufacturing method pertaining to an above-described aspect wherein the surface treatment is a fluorine gas plasma treatment.

In the manufacturing methods according to such aspects, the surface of the bank layer that is formed has liquid repellency. Due to this, the risk is reduced of outflow of ink over the bank layer. In addition, in these manufacturing methods, heat-caused loosening is suppressed from occurring during the forming of the bank layer, and thus the portions of the bank layer around the apertures are provided with great inclination angles. Thus, the influence that the bank layer having liquid repellency has on wettability inside the apertures is reduced.

Another aspect of the present invention is the manufacturing method pertaining to an above-described aspect wherein the forming of the bank layer further includes after baking of the photoresist, exposing a top side of the substrate to ultraviolet radiation. According to this manufacturing method, the exposure to UV radiation increases the wettability inside the apertures. In addition, in this manufacturing method, heat-caused loosening is suppressed from occurring during the forming of the bank layer, and thus the portions of the bank layer around the apertures are provided with great inclination angles. Thus, this manufacturing method ensures a desirable level of wettability inside the apertures without relying upon exposure to excessive UV radiation, and thus, allows the exposure to UV radiation to be performed at an UV radiation amount suitable under manufacturing conditions.

Another aspect of the present invention is the manufacturing method pertaining to an above-described aspect wherein the exposure of the photoresist having the apertures formed therein is performed by using a photomask that is light-transmissive at all areas thereof. This manufacturing method facilitates performing the masked exposure and the supplementary exposure under the same exposure conditions. Thus, the manufacturing method has advantageous effects such as transforming incompletely-exposed areas of the photoresist into stable exposed areas and simplifying the manufacture process.

Another aspect of the present invention is the manufacturing method pertaining to an above-described aspect wherein the photoresist is a negative photoresist. This manufacturing method provides the developed photoresist with a reverse tapered shape, and thus facilitates providing portions of the bank layer around the apertures with even greater inclination angles.

Note that in the present disclosure, terms and expressions related to the upward direction do not necessarily indicate positions and directions related to the vertically upward direction (upward direction under an absolute spatial frame of reference). Rather, such terms are used to indicate relative positions and directions that are defined based on the order in which layers are stacked in an organic EL display panel having a multi-layer structure. Specifically, an upward direction in an organic EL display panel refers to a direction that is perpendicular to the main surface of the substrate and that is from the substrate towards the layers of the organic EL display panel. Further, for example, the expression "on a substrate" used to indicate an area of an organic EL display panel not only refers to an area that is in direct contact with the substrate, and may also refer to an area that is located in the upward direction from the substrate with one or more layers between the area and the substrate.

Embodiment

The following describes an organic EL display panel manufacturing method pertaining to one aspect of the present invention, with reference to the accompanying drawings. Note that some of the drawings are schematics, and in such drawings, components may be illustrated at scales, aspect ratios, etc., differing from their actual scales, aspect ratios, etc. Further, in the present disclosure, the terms "plan view" and "plan view photograph" respectively refer to a view and a photograph showing an object from a viewpoint set in a perpendicularly upward direction from the object. In particular, the terms "plan view" and "plan view photograph", when used in connection with an organic EL display panel, respectively refer to a view and a photograph showing the panel from a viewpoint set in the perpendicularly upward direction from the top face of a substrate of the panel.

1. Overall Structure of Organic EL Display Device 1

FIG. 1 is a block diagram illustrating the structure of an organic EL display device 1. The organic EL display device 1 is a display device used in a device such as a television, a personal computer, a portable terminal, or an industrial display such as a digital signage or a large-size screen for commercial facilities. The organic EL display device 1 includes an organic EL display panel 10 and a drive control unit 20 that is electrically connected to the organic EL display panel 10.

The present embodiment provides description based on an example where organic EL display panel 10 (referred to in the following as a panel 10) is a top-emission-type organic EL display panel having a rectangular top surface serving as an image display face. The panel 10 includes organic EL elements (undepicted) that are arrayed along the image display face, and displays images by combining light emitted from the organic EL elements. Further, the present embodiment provides description based on an example where the panel 10 uses the active matrix scheme.

The drive control unit 20 includes drive circuits 21 and a control circuit 22. The drive circuits 21 are connected to the panel 10. The control circuit 22 is connected to, for example, an external device such as a computer and/or a receiver device such as an antenna. Each drive circuit 21 includes a power supply circuit supplying organic EL elements with electric power, a signal circuit supplying voltage signals controlling electric power supplied to organic EL elements, and a scan circuit that switches, at predetermined intervals, portions where the voltage signals are applied. The control circuit 22 controls the operations of the drive circuits 21 depending upon data that is input thereto from the device(s) to which the control circuit 22 is connected and that includes information on image(s).

FIG. 1 illustrates an example where four drive circuits 21 are arranged surrounding the panel 10. However, the drive control unit 20 need not have the structure illustrated in FIG. 1, and the quantity, the positions, etc., of the drive circuits may be changed as appropriate.

2. Structure of Panel 10

(1) Plan View Structure

Figure 2:
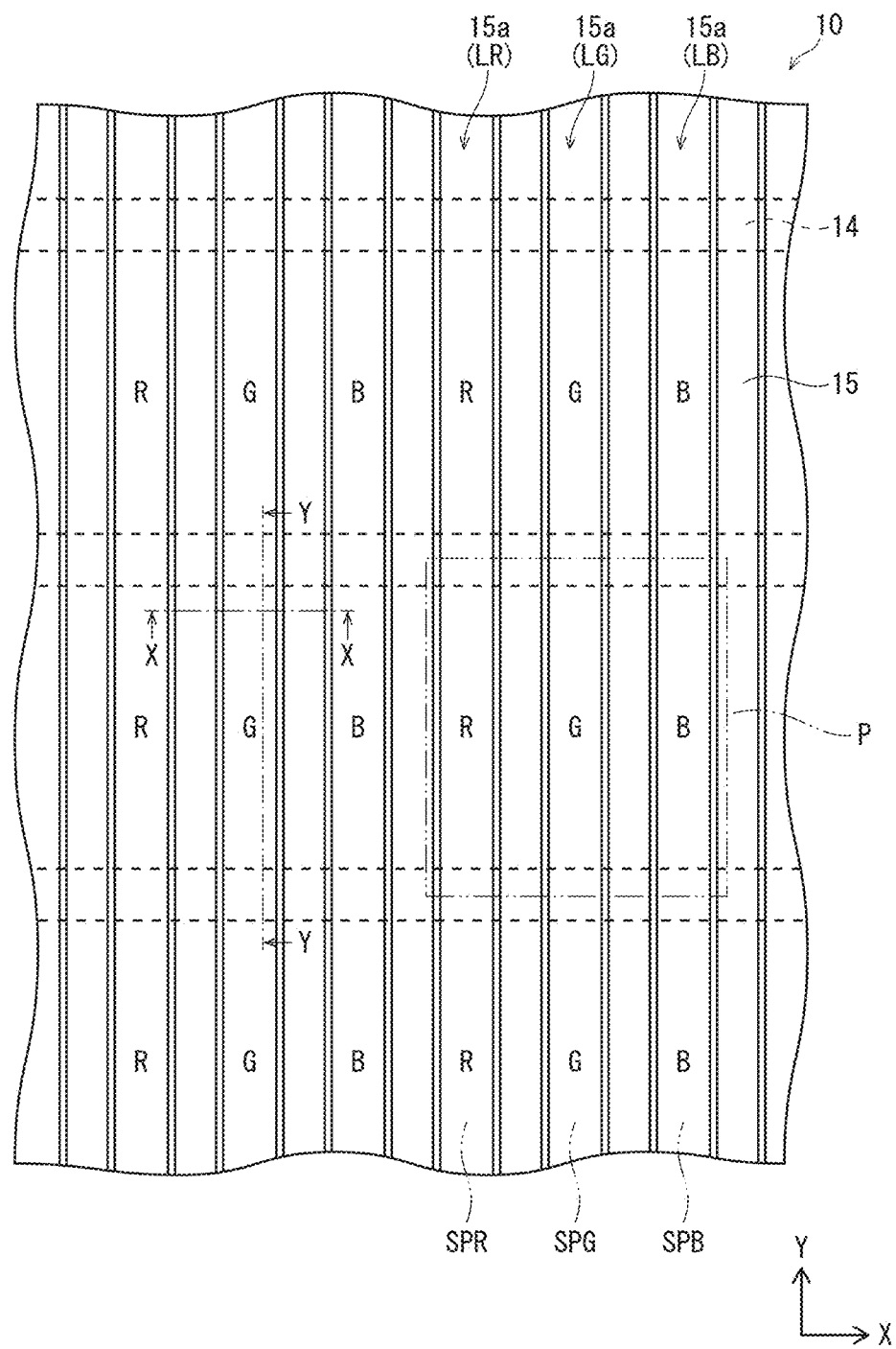
FIG. 2 is a schematic plan view showing a portion of an image display face of the organic EL display panel 10 in enlarged state.

FIG. 2 is a schematic plan view showing a portion of the image display face of the panel 10 in enlarged state. The panel 10, for example, includes a plurality of sub-pixel sequences, each of which includes subpixels SPR, SPG, and SPB, respectively emitting light of the colors red, green, and blue, arranged in the stated order. Each sub-pixel sequence corresponds to one pixel P of the panel 10. Further, each pixel P is capable of performing full-color representation, by combining light from a sub-pixel SPR, light from a sub-pixel SPG, and light from a sub-pixel SPB, each having gradation-controlled luminance.

Here, description is provided on an example where the panel 10 has a line bank structure. Specifically, the panel 10 has a pixel defining layer 14 and a bank layer 15. The pixel defining layer 14 has linear portions that extend in the X-axis direction in FIG. 2 and that are spaced away from one another in the Y-axis direction in FIG. 2. The bank layer 15 has linear portions that extend in the Y-axis direction and that are spaced away from one another in the X-axis direction. Further, adjacent ones of the linear portions of the bank layer 15 define an aperture 15a therebetween. The panel 10 has a plurality of apertures 15a, each aperture 15a has areas where the pixel defining layer 14 is present and areas where the pixel defining layer 14 is not present, and in each area where the pixel defining layer 14 is not present, one organic EL element of the panel 10 is disposed.

Specifically, each sub-pixel (each sub-pixel SPR, each sub-pixel SPG, and each sub-pixel SPB) is an area of an aperture 15a where an organic EL element is disposed, and emits light by light emitted by the organic EL element being guided towards the image display surface of the panel 10. Here, a light-emission color of a sub-pixel may be the same as the light-emission color of the organic EL element included in the sub-pixel, or may differ from the light-emission color of the organic EL element included in the sub-pixel due to provision of a color filter for adjusting light-emission color.

Further, each aperture 15a has disposed therein only one of the three types of sub-pixels (i.e., sub-pixels SPR, sub-pixels SPG, or sub-pixels SPB). Thus, each aperture 15a has disposed therein one of: a sub-pixel sequence LR that is a sequence of sub-pixels SPR; a sub-pixel sequence LG that is a sequence of sub-pixels SPG; and a sub-pixel sequence LB that is a sequence of sub-pixels SPB.

(2) Cross-Sectional Structure

Figure 3A:
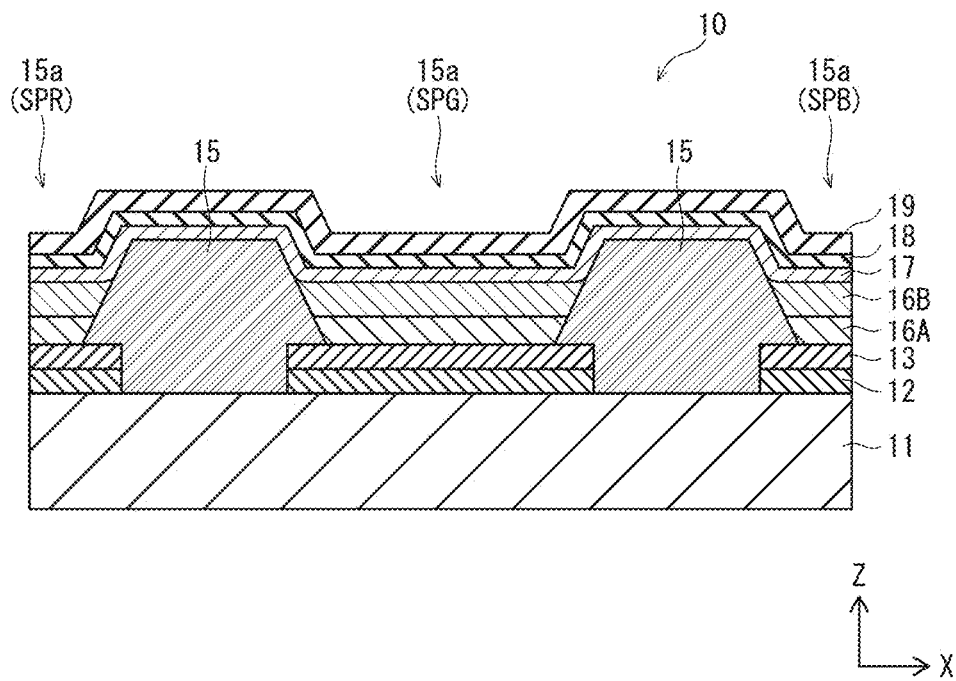
FIG. 3A is a schematic cross-sectional view taken along line X-X in FIG. 2.
Figure 3B:
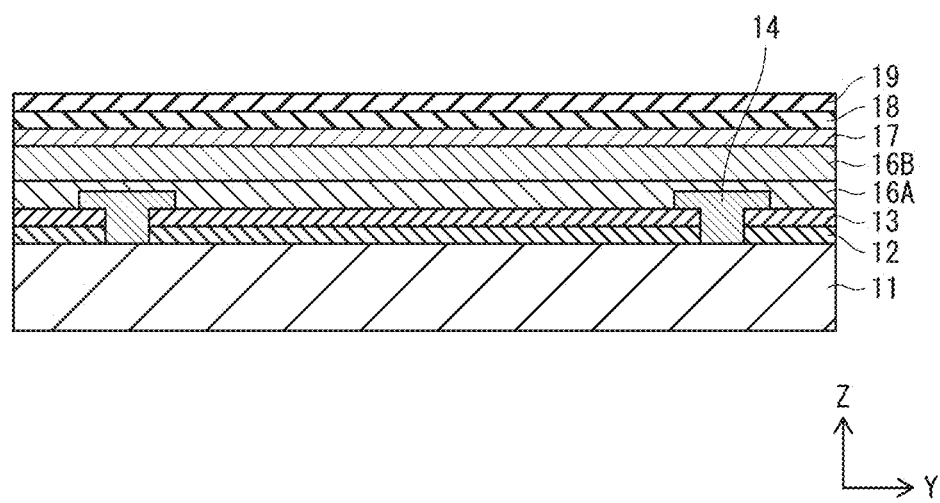
FIG. 3B is a schematic cross-sectional view taken along line Y-Y in FIG. 2.

FIG. 3A is a schematic cross-sectional view taken along line X-X in FIG. 2, and FIG. 3B is a schematic cross-sectional view taken along line Y-Y in FIG. 2. FIGS. 3A and 3B provide illustration focusing on the cross-sectional structure of a sub-pixel SPG. However, the sub-pixels SPR and the sub-pixels SPB each have a structure similar to that illustrated in FIGS. 3A and 3B.

The sub-pixel SPG (i.e., an organic EL element of the panel 10) includes a substrate 11, a first electrode 12, a hole injection layer 13, the pixel defining layer 14, the bank layer 15, a hole transport layer 16A, an organic light-emitting layer 16B, an electron transport layer 17, a second electrode 18, and a thin film sealing layer 19. Among such layers included in the panel 10, the hole transport layer 16A and the organic light-emitting layer 16B are formed by using a wet process. The layers described above are mere examples of the layers that may be included in the panel 10, and in addition to the layers described above, a sub-pixel may include one or more other layers, such as an electron injection layer, a blocking layer, and/or a buffer layer. Also, the panel 10 may not include one or more of the layers described above. Further, the panel 10 may include a layer, such as an electron injection/transport layer, that is a single layer in a physical viewpoint but achieves multiple functions.

a. Substrate 11

The substrate 11 serves as a support of the panel 10. Although not illustrated in any of the drawings, the substrate 11 includes a main body having a rectangular plate-like shape and a thin film transistor (TFT) layer disposed on the main body.

The main body is made of an electrically-insulative material, or a metal material such as aluminum or stainless steel coated with an electrically-insulative material. For example, the electrically-insulative material may be a glass material such as non-alkali glass, soda glass, nonfluorescent glass, phosphate glass, borate glass, or quartz glass. Alternatively, the electrically-insulative material may be a resin material such as acrylic resin, styrenic resin, polycarbonate resin, epoxy resin, polyethylene resin, polyester resin, polyimide resin, or silicone resin. Alternatively, the electrically-insulative material may be a metal oxide material such as aluminum oxide.

Since an organic EL element may undergo degradation when reacting with substances such as moisture and oxygen, it is preferable to use a material having a low moisture transmission rate, such as glass or metal, for the main body in order to prevent substances such as moisture and oxygen from penetrating into the organic EL element from below. Further, when using a resin material for the main body, it is preferable that a thin film of a material having a low moisture transmission rate, such as silicon nitride, silicon oxynitride, or aluminum oxide, be disposed on the top surface of the resin material to coat the resin material.

The TFT layer is constituted of electronic circuitry formed on the main body, and includes, for example, power supply circuitry supplying organic EL elements with power and control circuitry controlling power supply to organic EL elements. Specifically, the TFT layer is a combination of layers above the main body, including a semiconductor layer, an electrical conductor layer, and an electrical insulator layer. Due to the inclusion of such layers, electronic circuit components, such as TFT elements, capacitor elements, and wiring, are formed in the TFT layer. Also, the TFT layer has, at a topmost portion thereof, an interlayer electrical insulation layer (undepicted) planarizing the top surface of the substrate 11.

For example, the semiconductor layer may be made of a conventional semiconductor material such as silicon, an oxide semiconductor material such as indium gallium zinc oxide, or an organic semiconductor material such as a heteroaromatic compound, having a conjugated, planar 7C electron system. For example, the electrical conductor layer may be made of a metal material such as aluminum (Al), copper (Cu), or gold (Au), a carbon material such as graphite or a carbon nanotube, or an electrically conductive oxide material such as indium tin oxide (ITO) or indium zinc oxide (IZO). For example, the electrical insulator layer may be made of an inorganic material such as silicon nitride, silicon oxide, silicon oxynitride, or aluminum oxide, or an organic material such as acrylic resin, polyimide resin, silicone resin, or phenolic resin. For example, the interlayer electrical insulation layer is made of a material that is electrically insulative and that can be patterned, one example of which is an organic material such as acrylic resin, polyimide resin, silicone resin, or phenolic resin.

Note that the TFT layer may further include, apart from the interlayer electrical insulation layer, a passivation layer that is made for example of silicon nitride or aluminum oxide and that covers all the electronic circuit components of the TFT layer.

b. First Electrode 12

The first electrode 12 is disposed on the substrate 11, and serves as an anode supplying the organic light-emitting layer 16B with holes. Further, the first electrode 12 defines the position of the organic EL element, and when the panel 10 is seen in entirety, first electrodes 12 corresponding to the sub-pixels SPR, SPG, and SPB are disposed to form a matrix on the substrate 11.

For example, the first electrode 12 is made of a metal material such as Al, silver (Ag), molybdenum (Mo), tungsten (W), titanium (Ti), chromium (Cr), nickel (Ni), or zinc (Zn). Alternatively, the first electrode 12 may be made of an alloy material containing a combination of two or more such metal materials, or may have a multi-layer structure including a layer of metal material and a layer of an alloy material. In addition, a layer of a light-transmissive electrically-conductive oxide material may be disposed on the first electrodes 12, for the purpose of, for example, improving the adhesion between the first electrode 12 and the hole injection layer 13 and avoiding oxidization of the first electrode 12. Further, the first electrode 12 may include, at a bottom-most portion thereof, a barrier metal layer made of a metal oxide material such as tungsten oxide for purposes such as suppressing deterioration in wet-etching and suppressing the spread of hydrogen to layer(s) below the first electrode 12.

Note that since the first electrode 12 supplies holes, it is preferable that the first electrode 12 be made of a material having a high work function. Further, since the panel 10 is a top-emission-type organic EL display panel, it is preferable that the first electrode 12 have optical reflectivity.

c. Hole Injection Layer 13

The hole injection layer 13 is disposed on the first electrode 12, and has the function of lowering the energy barrier to be overcome in supplying (injecting) holes from the first electrode 12 into the organic light-emitting layer 16B and thus facilitating hole injection. When the panel 10 is seen in entirety, the panel 10 includes a separate hole injection layer 13 for every first electrode 12, and the hole injection layers 13 are disposed to form a matrix above the substrate 11. The hole injection layer 13 is made of a functional material, or more specifically, a material having an appropriate level of ionization energy. Examples of such materials include metal oxide materials such as oxides of Ag, Mo, Cr, W, Ni, vanadium (V), and iridium (Ir), and PEDOT (mixture of polythiophene and polystyrene sulfonic acid).

d. Pixel Defining Layer 14

As illustrated in FIG. 3B, the pixel defining layer 14 is an electrically-insulative layer covering end portions of the first electrode 12 and the hole injection layer 13. The pixel defining layer 14 improves the electrical insulation between adjacent sub-pixels (sub-pixels SPR, sub-pixels SPG, or sub-pixels SPB) in each aperture 15a. Further, the height of the pixel defining layer 14 is lower than the top surface of the hole transport layer 16A. Due to this, in each aperture 15a, one hole transport layer 16A and one organic light-emitting layer 16B each extend continuously across the aperture 15a without any breaks. When the panel 10 is seen in entirety, the pixel defining layer 14 has portions extending continuously in the X-axis direction in FIG. 2 and covering Y-axis direction end portions of the first electrodes 12 and the hole injection layers 13. Thus, the pixel defining layer 14 has portions that extend in the X-axis direction and that are spaced away from one another in the Y-axis direction.

For example, the pixel defining layer 14 may be made of an inorganic material such as silicon nitride, silicon oxide, silicon oxynitride, or aluminum oxide, or an organic material such as acrylic resin, polyimide resin, or novolac-type phenolic resin. Further, in order to promote the spread of functional material-containing ink for the hole transport layer 16A in each aperture 15a, it is preferable that the pixel defining layer 14 have liquid philicity at surfaces thereof. In other words, it is preferable that the pixel defining layer 14 does not contain a liquid repellent component, an example of which is described later in the present disclosure.

e. Bank Layer 15

The bank layer 15 is formed above the substrate 11 having the first electrodes 12, the hole injection layers 13, and the pixel defining layer 14 formed thereon. The bank layer 15 is disposed to define apertures 15a above the first electrodes 12. Specifically, in the panel 10, each aperture 15a exposes a plurality of hole injection layers 13, which are disposed above the corresponding first electrodes 12. Further, each aperture 15a extends continuously in the Y-axis direction in FIG. 2, and between hole injections layers 13 adjacent in the Y-axis direction, exposes a portion of the pixel defining layer 14. Thus, the bank layer 15 has portions that extend in the Y-axis direction and that are spaced away from one another in the X-axis direction. Thus, the bank layer 15 has a so-called line bank structure.

The bank layer 15 prevents the outflow of functional material-containing inks for the hole transport layers 16A and the organic light-emitting layers 16B from predetermined ink application positions. Further, once the forming of the hole transport layers 16A and the organic light-emitting layers 16B is completed, portions of the bank layer 15 serve as partitions providing electrical insulation between adjacent ones of the hole transport layers 16A and adjacent ones of the organic light-emitting layers 16B.

For example, the bank layer 15 is made of a photoresist, which is typically electrically insulative and can be patterned through photolithography. Examples of photoresists include acrylic resin, polyimide resin, and novolac-type phenolic material. Note that the bank layer 15 need not contain only the photoresist. Further, the photoresist may be a negative photoresist, whose solubility to the developer decreases upon exposure, or may be a positive photoresist, whose solubility to the developer increases upon exposure. However, it is preferable that the photoresist be a negative photoresist. This is since with negative photoresist, it is easier to provide the bank layer 15 with slope portions having great inclination angles. Typically, when photoresist is exposed to light from above, reverse tapered shape areas of the photoresist likely undergo reaction to the light. That is, the areas undergoing reaction are wide at the top and narrow at the bottom. Thus, when using a negative photoresist, with which exposed areas remain after developing, the photoresist after developing has a shape close to a reverse tapered shape. Accordingly, slope portions of the bank layer 15 formed by using a negative photoresist is more likely to have greater inclination angles than slope portions of a bank layer formed by using a positive photoresist.

Further, due to manufacturing of the panel 10 including the processes described later in the present disclosure, it is preferable that the bank layer 15 have resistance against, for example, organic solvents and heat. Further, it is preferable that the bank layer 15 have liquid repellency at surfaces thereof, in order to prevent the outflow of ink therefrom. Preferable measures for achieving this include using a material containing a liquid repellent component for the bank layer 15 or performing surface treatment to provide the bank layer 15 with liquid repellency. Examples of such liquid repellent components include fluorine compounds and siloxane compounds. For example, the liquid repellent component may be a separate material mixed with the photoresist 15P, or may be contained in the photoresist 15P when the photoresist 15P is a copolymer, similar to the liquid-repellent resist composition disclosed in Patent Literature 3. Further, one example of the surface treatment for providing the bank layer 15 with liquid repellency is fluorine gas plasma treatment.

f. Hole Transport Layer 16A

The hole transport layer 16A is disposed in each aperture 15a defined by the bank layer 15, through a wet process. The hole transport layer 16A improves the transportation of holes from the first electrode 12 to the organic light-emitting layer 16B. Further, since the panel 10 has the line bank structure, the hole transport layer 16A in each aperture 15a extends continuously in the Y-axis direction in FIG. 2 to cover all first electrodes 12 (hole injection layers 13) and the pixel defining layer 14 in the aperture 15a. That is, in each sub-pixel sequence (each sub-pixel sequence LR, each sub-pixel sequence LG, and each sub-pixel sequence LB), the sub-pixels in the sub-pixel sequence (sub-pixels SPR, sub-pixels SPG, or sub-pixels SPB) share a single hole transport layer 16A.

The hole transport layer 16A is made of a functional material, or more specifically, an organic material having relatively high hole mobility. For example, examples of such organic materials include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound, a styrylamine compound, a butadiene compound, a polystyrene derivative, a triphenylmethane derivative, and a tetraphenylbenzene derivative, all of which are disclosed in Japanese Patent Application Publication No. H5-163488.

g. Organic Light-Emitting Layer 16B

Similar to the hole transport layer 16A, the organic light-emitting layer 16B is disposed in each aperture 15a defined by the bank layer 15, through a wet process. The organic light-emitting layer 16B emits light by an electric-field light-emission phenomenon taking place therein when holes from the first electrode 12 and electrons from the second electrode 18 recombine therein. Further, since the panel 10 has the line bank structure, the organic light-emitting layer 16B in each aperture 15a extends continuously in the Y-axis direction in FIG. 2, similar to the hole transport layer 16A, to cover the entirety of the hole transport layer 16A in the aperture 15a. That is, in each sub-pixel sequence (each sub-pixel sequence LR, each sub-pixel sequence LG, and each sub-pixel sequence LB), the sub-pixels in the sub-pixel sequence (sub-pixels SPR, sub-pixels SPG, or sub-pixels SPB) share a single organic light-emitting layer 16B. Meanwhile, only portions of each organic light-emitting layer 16B above the first electrodes 12 emit light. That is, each portion of an organic light-emitting layer 16B that corresponds to a sub-pixel (sub-pixel SPR, sub-pixel SPG, or sub-pixel SPB) emits light independently.

The organic light-emitting layer 16B is made of a functional material, or more specifically, an organic light-emitting material that emits light through an electric-field light-emission phenomenon. Examples of such organic materials include conventional fluorescent and phosphorescent materials, such as the fluorescent materials disclosed in Japanese Patent Application Publication No. H5-163488, which include an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound, azaquinolone compound, pyrazoline derivative, pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group III metal, metal complex of oxine, and rare earth metal complex. Alternatively, for example, the organic light-emitting layer 16B may be made of a combination of an organic compound and one or more of the fluorescent and phosphorescent materials described above inserted into the organic compound as a dopant. Further, the panel 10 achieves full-color display due to the organic light-emitting layers 16B in the sub-pixel sequences LR containing organic light-emitting material emitting red light, the organic light-emitting layers 16B in the sub-pixel sequences LG containing organic light-emitting material emitting green light, and organic light-emitting layers 16B in the sub-pixel sequences LB containing organic light-emitting material emitting blue light (i.e., separate application of three different organic light-emitting materials each corresponding to a different color being performed).

h. Electron Transport Layer 17

The electron transport layer 17 covers the entirety of the substrate 11 having the bank layer 15 and the organic light-emitting layers 16B formed thereon. The electron transport layer 17 improves the transport of electrons from the second electrode 18 to the organic light-emitting layers 16B.

The electron transport layer 17 is made of a functional material, or more specifically, an organic material having relatively high electron mobility. Examples of such organic materials include a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative, all of which are disclosed in Japanese Patent Application Publication No. H5-163488, and a phosphorous oxide derivative, a triazole derivative, a triazine derivative, a silole derivative, a dimesitylboron derivative, and a triarylboron derivative.

i. Second Electrode 18

The second electrode 18 is disposed on the organic light-emitting layer 16B, and when the panel 10 is seen in entirety, is disposed over the entire substrate 11 to cover the electron transport layer 17. The second electrode 18 serves as a cathode supplying the organic light-emitting layers 16B with electrons.

For example, the second electrode 18 is made of a light-transmissive electrically-conductive oxide material such as ITO or IZO, or a combination of a layer made of such light-transmissive electrically-conductive oxide material and a layer made of a metal material such as Ag, Au, Ni, Cu, Al, platinum (Pt), or palladium (Pd), or an alloy material containing a combination of two or more of such metal materials.

Note that since the second electrode 18 supplies electrons, it is preferable that the second electrode 18 be made of a material having a low work function. Further, since the panel 10 is a top-emission-type organic EL display panel, it is preferable that a material having high optical transmissivity (e.g., an optical transmittance of 80% or higher) be used for the second electrode 18.

j. Thin Film Sealing Layer 19

The thin film sealing layer 19 is a layer covering the entirety of the substrate 11 with the above-described components from the first electrodes 12 to the second electrode 18 formed thereon, and prevents those components from being exposed to substances such as moisture and oxygen. The thin film sealing layer 19 is made of a material having a low moisture transmission rate, an example of which is an inorganic material such as silicon nitride, silicon oxynitride, carbon oxide, carbon nitride, or aluminum oxide. Further, since the panel 10 is a top-emission-type organic EL display panel, it is preferable that a material which has high optical transmissivity and whose refractive index does not differ much from the refractive index of the second electrode 18 be used for the thin film sealing layer 19.

k. Additional Components

Note that the panel 10 may further include, disposed above the substrate 11 having all the components described above formed thereon, a sealing plate that is made of a material having a low moisture transmission rate, such as a glass material. When providing such a sealing plate to the panel 10, the sealing plate is adhered to the substrate 11 with an adhesion layer made for example of a curable resin material disposed between the sealing plate and the substrate 11. The provision of such a sealing plate to the panel 10 prevents substances such as moisture and oxygen from penetrating into the organic EL elements disposed on the substrate 11.

Further, the panel 10 may further include color filters provided to the sealing plate at positions corresponding to the sub-pixels (sub-pixels SPR, SPG, and SPB). The provision of such color filters enables adjustment of the color of light emitted from the sub-pixels (sub-pixels SPR, SPG, and SPB). Further, the panel 10 may further include black matrices provided to the sealing plate at positions corresponding to the areas between the sub-pixels (sub-pixels SPR, SPG, and SPB) and a peripheral area of the sealing plate. The provision of such black matrices prevents the reflection of incoming light at the image display face of the panel 10, and also improves the contrast between areas of the image display face corresponding to the pixels P and the rest of the image display face.

Note that the cross-sectional structure of the panel 10 described above is a mere example of a cross-sectional structure that the panel 10 may have. For example, while FIG. 3A illustrates each of the electron transport layer 17 and the second electrode 18 extending continuously over the apertures 15a, at least one of the electron transport layer 17 and the second electrode 18 may be disposed in plurality one for each aperture 15a or one for each of the sub-pixels (sub-pixels SPR, SPG, and SPB). Further, FIGS. 3A and 3B illustrate a plurality of hole injection layers 13 being disposed, one for each of the sub-pixels (sub-pixels SPR, SPG, and SPB). However, a plurality of hole injection layers 13 may be disposed one for each aperture 15a, or one hole injection layer 13 may be disposed to extend continuously across the apertures 15a.

3. Manufacturing Method of Panel 10

(1) Overall Manufacturing Process

The following describes an overall manufacturing process of the panel 10, in connection with the manufacturing method of the panel 10 pertaining to one aspect of the present invention. FIGS. 4A through 4C, FIGS. 5A through 5C, and FIGS. 6A through 6C are schematic cross-sectional diagrams illustrating manufacturing procedures of the panel 10. Note that FIGS. 4A through 4C, FIGS. 5A through 5C, and FIGS. 6A through 6C all illustrate a cross-section corresponding to the cross-section of the sub-pixel SPG illustrated in FIG. 3A. Further, FIGS. 4B and 4C each illustrate the pixel defining layer 14 without any hatching. Hatching is not provided to the pixel defining layer 14 since the pixel defining layer 14 is not included in the cross-section shown in FIGS. 4B and 4C, and rather, is included in a cross-section located behind the cross-section shown in FIGS. 4B and 4C.

a. Preparation of Substrate

First, the substrate 11 is prepared. Specifically, the main body is first prepared by shaping an electrically insulative material into a flat plate, and then the TFT layer is formed on the main body. For example, the forming of the TFT layer may be performed as follows.

First, predetermined electronic circuitry is formed on the main body by forming a layer of semiconductor material, a layer of an electrical conductor material, and a layer of an electrical insulator material, and then patterning these layers into predetermined shapes. The forming of each of such layers is performed by using a method suitable for the material of the layer. For example, a dry process such as vacuum vapor deposition, electronic beam vapor deposition, ion plating, or chemical vapor deposition may be used, or a wet process such as printing, spin coating, ink jet application, dispenser coating, or die-coating may be used. For example, the patterning may be performed through photolithography, shadow masking, or metal masking. Alternatively, the layers may be formed to have their predetermined shapes in the first place through a wet process. Further, additional treatment such as plasma injection, ion injection, and/or baking may be performed as necessary after the layers have been formed.

Subsequently, the passivation layer and the interlayer electrically-insulative layer are formed in this order to cover the electronic circuitry. The forming of each of the passivation layer and the interlayer electrically-insulative layer is performed by using a method that is suitable for the material of the layer, by selecting a method from among the dry processes and wet processes described above. Note that apertures (contact holes) are formed at predetermined positions of each of the passivation layer and the interlayer electrically-insulative layer. These contact holes are for electrically connecting the TFT elements of the electronic circuitry with the first electrodes 12. These contact holes may be formed by using any of the patterning methods described above.

b. Forming of First Electrodes and Hole Injection Layers

Figure 4A:
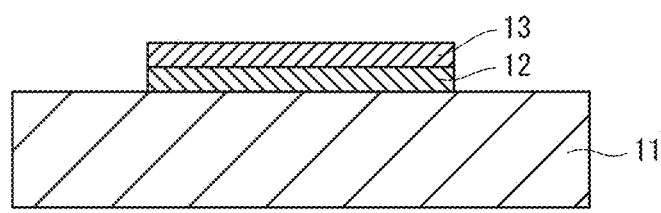
FIGS. 4A through 4C are schematic cross-sectional views illustrating manufacturing procedures of the organic EL display panel 10, with FIG. 4A illustrating the forming of first electrodes and hole injection layers, FIG. 4B illustrating the forming of a pixel defining layer, and FIG. 4C illustrating the forming of a bank layer.
Figure 4B:
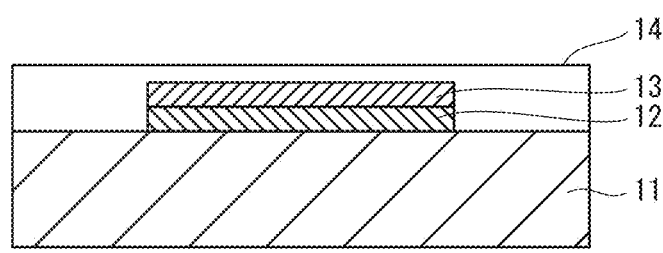

Then, the first electrodes 12 and the hole injection layers 13 are formed on the substrate 11. For example, sputtering is first performed to form a thin film of metal on the substrate 11, and then, reactive sputtering is continuously performed to form a thin film of a metal oxide on the metal thin film. Subsequently, photoresist material is applied onto the metal oxide thin film, and then patterning of the photoresist material is performed through photolithography so that remaining portions of the photoresist material form a matrix at areas where the sub-pixels SPR, SPG, and SPB are to be formed. Subsequently, dry etching and wet etching are performed one after another in this order to etch the metal oxide thin film and the metal thin film at areas where the photoresist material is no longer remaining. Finally, the photoresist material and residue on the metal oxide thin film is removed, to form a matrix of first electrodes 12, made of the metal thin film, and a matrix of hole injection layers 13, made of the metal oxide thin film (FIG. 4A). Performing the etching for the first electrodes 12 and the etching for the hole injection layers 13 one after another as described above improves the efficiency of the manufacturing process of the panel 10. Further, due to the patterning for the first electrodes 12 and the hole injection layers 13 being performed by using the same photoresist material as described above, the accuracy of the alignment of the first electrodes 12 and the hole injection layers 13 can be improved.

Note that the first electrodes 12 and the hole injection layers 13 need not be formed through a combination of reactive sputtering and photolithography as described above. That is, the first electrodes 12 and the hole injection layers 13 may be alternatively formed through any of the dry processes, wet processes, or patterning described above, depending upon the material used for the first electrodes 12 and the injection layers 13. Further, forming of the first electrodes 12 with barrier metal layers at the bottommost portions thereof can be performed by first forming a thin film of a metal oxide before forming the metal thin film, and then performing the wet etching of the metal thin film and dry etching of the metal oxide thin film sequentially. Further, in the manufacturing method of the panel 10, the etching for the first electrodes 12 and the etching for the hole injection layers 13 need not be performed one after another as described above. For example, the hole injection layers 13 may be formed after the forming of the first electrodes 12 through forming a metal oxide thin film and patterning the metal oxide thin film.

c. Forming of Pixel Defining Layer

Subsequently, the pixel defining layer 14 is formed on the substrate 11 having the first electrodes 12 and the hole injection layers 13 formed thereon. Specifically, thin films of an inorganic material are formed through a combination of a dry process described above and patterning, so that the thin films extend along the X-axis direction in FIG. 2 to cover end portions of the hole injection layers 13 and are spaced away from one another in the Y-axis direction in FIG. 2. Accordingly, the pixel defining layer 14 with the shape illustrated in FIG. 2 is formed (FIG. 14B). Note that when using an organic material for the pixel defining layer 14, the forming of the pixel defining layer 14 may be performed, for example, through a wet process described above or photolithography.

d. Forming of Bank Layer

Figure 4C:
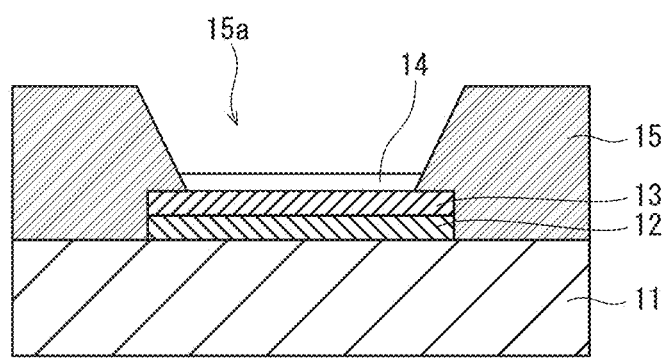

Subsequently, the bank layer 15, which is made of a photoresist and have apertures 15a at portions corresponding to the first electrodes 12, is formed through photolithography on the substrate 11 having the first electrodes 12, the hole injection layers 13, and the pixel defining layer 14 formed thereon (FIG. 4C). The forming of the bank layer 15 is described in detail later in the present disclosure.

e. Ink Application

Figure 5A:
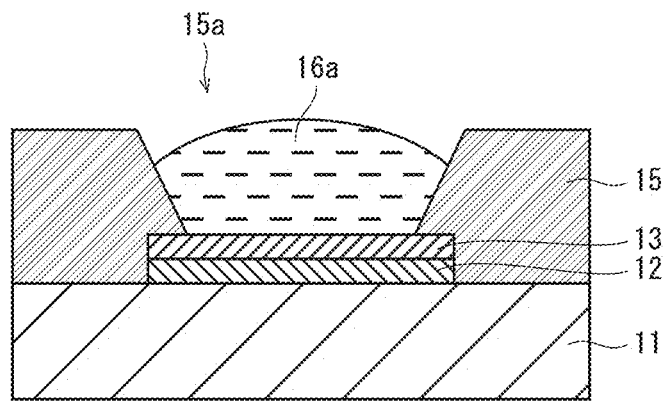
FIGS. 5A through 5C are schematic cross-sectional views illustrating manufacturing procedures of the organic EL display panel 10, with FIG. 5A illustrating ink application in the forming of a hole transport layer, FIG. 5B illustrating ink drying in the forming of the hole transport layer, and FIG. 5C illustrating the forming of an organic light-emitting layer.

Subsequently, an ink 16a containing a functional material, or more specifically, the material for the hole transport layers 16A, is applied to each of the apertures 15a (FIG. 5A). The application of the ink 16a is performed through a wet process described above, and preferably, is performed through inkjet printing. Note that the application of the ink 16a with respect to each of the apertures 15a is performed such that the ink 16a continuously covers the inside of the aperture 15a over the pixel defining layer 14. Applying the ink 16a in such a manner allows the ink 16a to flow in the Y-axis direction in FIG. 2 in each aperture 15a, which results in low application unevenness of the ink 16a in each aperture 15a. Consequently, the risk is reduced of the hole transport layers 16A in the apertures 15a, the forming of which is completed by drying the ink 16a following this process, having problems such as unevenness in film thickness and undesirable shape.

f. Drying

Figure 5B:
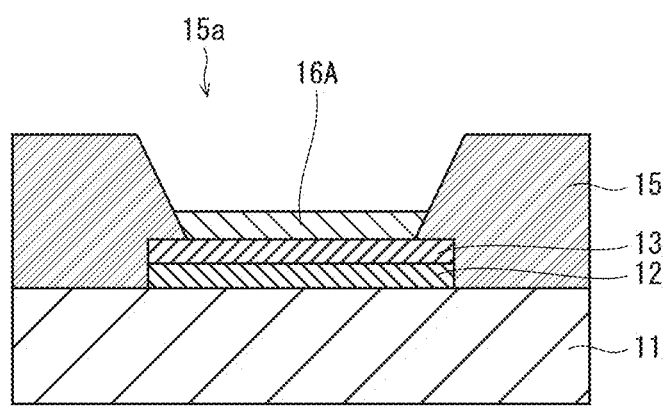

Subsequently, the ink 16a having been applied is dried. Specifically, the solvent contained in the ink 16a is caused to evaporate by placing the substrate 11 after the application of the ink 16a in a vacuum environment (e.g., in a vacuum chamber). Accordingly, the hole transport layers 16A are formed, one in each of the apertures 15a (FIG. 5B).

g. Forming of Organic Light-Emitting Layers

Figure 5C:
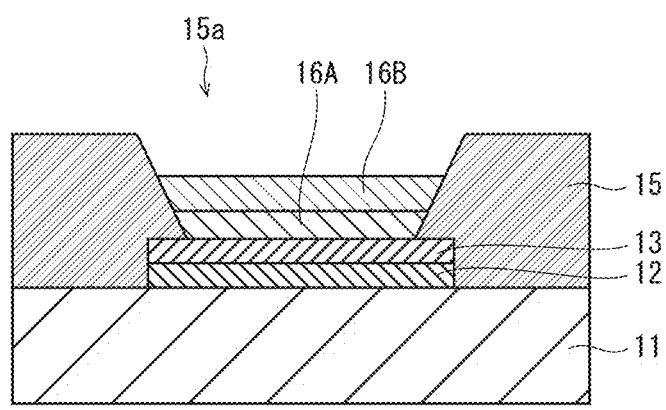

Subsequently, the organic light-emitting layers 16B, which are functional layers, are formed, one in each aperture 15a (FIG. 5C). The forming of the organic light-emitting layers 16B is performed through a method similar to that applied in the forming of the hole transport layers 16A. Specifically, an ink containing a functional material, or more specifically, the material for the organic light-emitting layers 16B, is applied to each of the apertures 15a, and then drying of the ink is performed. Note that the application of the ink for the organic light-emitting layers 16B with respect to each of the apertures 15a is performed such that the ink covers the entirety of the hole transport layer 16A formed inside the aperture 15a. This allows the ink to flow in the Y-axis direction in FIG. 2 in each aperture 15a. Such flow of the ink results in low application unevenness of the ink in each aperture 15a, and consequently, the risk is reduced of the organic light-emitting layers 16B in the apertures 15a, the forming of which is completed by drying the ink following this process, having problems such as unevenness in film thickness and undesirable shape.

h. Forming of Electron Transport Layer

Figure 6A:
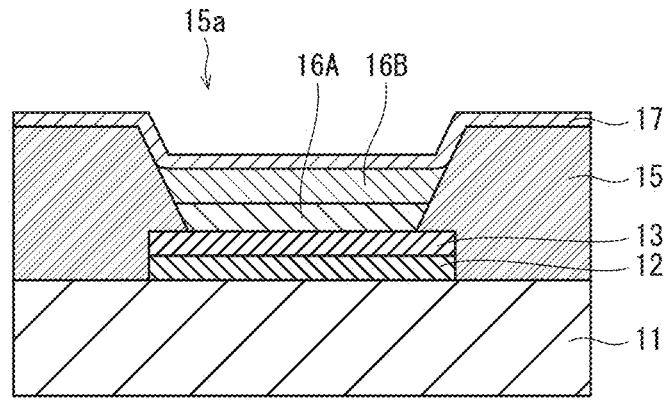
FIGS. 6A through 6C are schematic cross-sectional views illustrating manufacturing procedures of the organic EL display panel 10, with FIG. 6A illustrating the forming of an electron transport layer, FIG. 6B illustrating the forming of a second electrode, and FIG. 6C illustrating the forming of a thin film sealing layer.

Subsequently, the electron transport layer 17 is formed to cover the bank layer 15 and the organic light-emitting layers 16B (FIG. 6A). The forming of the electron transport layer 17 may be performed, for example, through a dry process or a wet process described above, depending upon the material for the electron transport layer 17.

i. Forming of Second Electrode

Figure 6B:
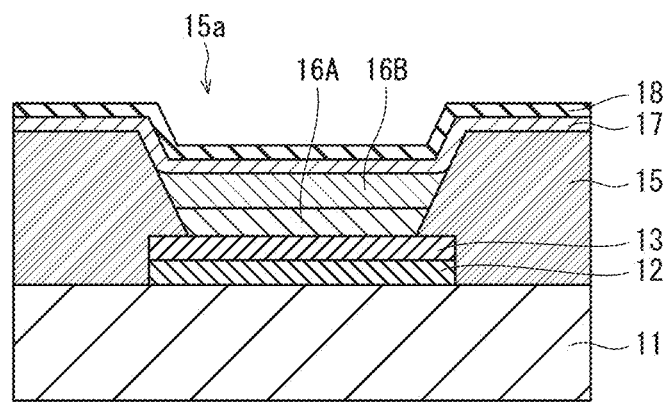

Subsequently, the second electrode 18 is formed to cover the electron transport layer 17 (FIG. 6B). The forming of the second electrode 18 may be performed, for example, by performing a dry process described above to form a thin film of a light-transmissive electrically conductive oxide material on the electron transport layer 17.

j. Sealing

Figure 6C:
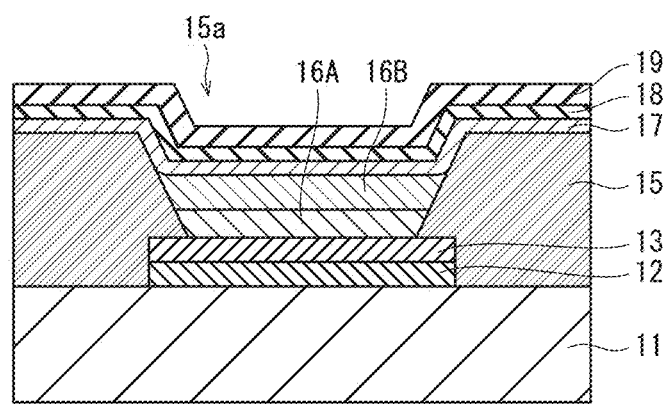

Subsequently, sealing of the substrate 11 having the layers from the first electrodes 12 to the second electrode 18 formed thereon is performed. Specifically, the forming of the thin film sealing layer 19 may be performed, for example, by performing a dry process described above to form a thin film of an inorganic material to cover the top surface of the substrate 11 having the layers up to the second electrode 18 formed thereon (FIG. 6C).

The panel 10 with the cross-sectional structure illustrated in FIG. 2 is formed according to this method.

(2) Forming of Bank Layer 15

The following describes in detail the forming of the bank layer 15 in the manufacturing method of the panel 10. FIGS. 7A through 7C and FIGS. 8A through 8C are schematic cross-sectional diagrams illustrating the forming of the bank layer 15 of the panel 10. Note that FIG. 7C and FIGS. 8A through 8C each illustrate the pixel defining layer 14 without any hatching. Hatching is not provided to the pixel defining layer 14 since the pixel defining layer 14 is not included in the cross-section shown in FIG. 7C and FIGS. 8A through 8C, and rather, is included in a cross-section behind the cross-section shown in FIG. 7C and FIGS. 8A through 8C.

a. Application of Photoresist

Figure 7A:
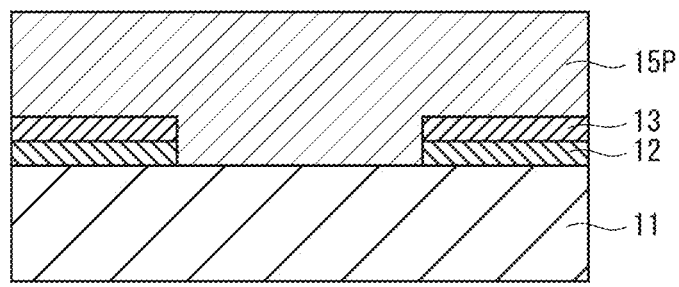
FIGS. 7A through 7C are schematic cross-sectional views illustrating procedures in the forming of the bank layer of the organic EL display panel 10, with FIG. 7A illustrating application of photoresist, FIG. 7B illustrating masked exposure, and FIG. 7C illustrating developing.

First, the photoresist 15P is applied onto the substrate 11 having the first electrodes 12, the hole injection layers 13, and the pixel defining layer 14 formed thereon, as illustrated in FIG. 7A. For example, the application of the photoresist 15P can be performed through a wet process described above, such as slit coating. After the application, it is preferable that vacuum drying and low temperature heat drying (pre-baking) at a temperature of around 60 degrees Celsius to 120 degrees Celsius be performed to remove excess solvent contained in the photoresist 15P and to fix the photoresist 15P to the substrate 11. Note that description provided herein is based on an example where the photoresist 15P is a negative photoresist.

b. Masked Exposure

Figure 7B:
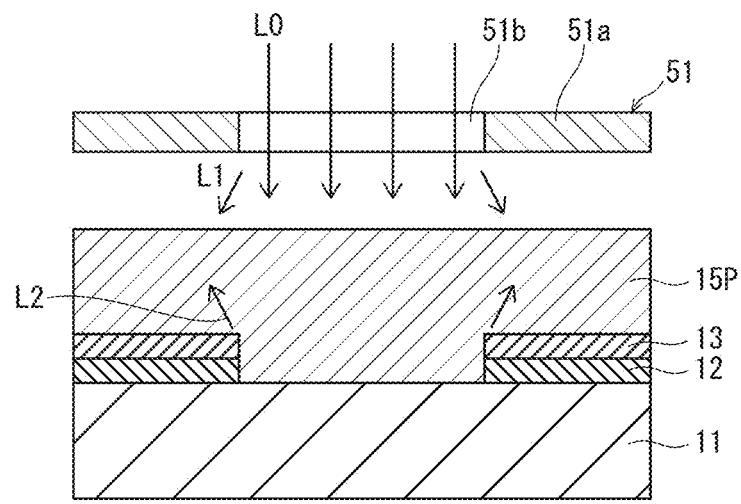

Subsequently, masked exposure of the photoresist 15P is performed as illustrated in FIG. 7B. Specifically, by using a photoresist exposure device or the like, a photomask 51 is placed above the substrate 11 having the photoresist 15P applied thereon, and the substrate 11 is exposed to light L0 from over the photomask 51.

Typically, the light L0 contains a combination of a g-line wavelength (436 nm), an h-line wavelength (405 nm), and an i-line wavelength (365 nm). However, for example, the light L0 may have one of a g-line, an h-line, and an i-line wavelength, may be an excimer laser, may be light having an extreme ultraviolet wavelength, or may be an X-ray. Among such possible types of the light L0, a type of light L0 suitable for the width of lines of the pattern of the bank layer 15 and the material for the bank layer 15 is to be selected. Further, a suitable exposure amount of light L0 is to be selected depending upon the photoresist 15P that is used. For example, the exposure amount may be set within a range from 100 mJ/cm$^2$ to 500 mJ/cm$^2$.

The photomask 51 has light blocking portions 51a that block the light L0 and light transmitting portions 51b that allow the light L0 to pass through. Note that in the photomask 51, the light blocking portions 51a correspond to the first electrodes 12. That is, the photomask 51 used in the manufacturing method of the panel 10 is such that, when the photomask 51 is placed above the substrate 11, the light transmitting portions 51a are located above the areas where the sub-pixel sequences LR, LG, and LB are to be formed.

When the photomask 51 having this structure is arranged above the substrate 11, only the light transmitting portions 51b expose the photoresist 15P to the light L0. That is, only the portions of the photoresist 15P below the light transmitting portions 51b are exposed to the light L0. Here, however, it should be noted that parts of the light L0 passing through the light transmitting portions 51b spread away from the light transmitting portions 51b (i.e., towards the light blocking portions 51a) by becoming diffracted light L1 and reflected light L2. As a result, the masked exposure produces, in the photoresist 15P, exposed areas 15Pa directly below the light transmitting portions 51b and incompletely-exposed areas 15Pb around the exposed areas 15Pa.

c. Developing

Figure 7C:
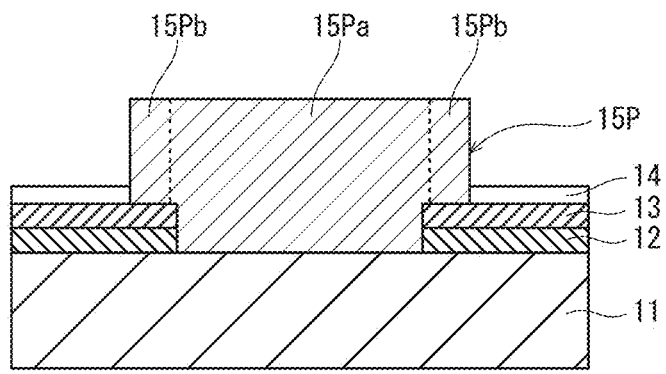

Subsequently, developing is performed as illustrated in FIG. 7C. Specifically, the developing is performed so that only the exposed areas 15Pa and the incompletely-exposed areas 15Pb of the photoresist 15P remain, and thus, so that apertures are formed in the photoresist 15P at areas corresponding to the first electrodes 12. For example, the developing is performed by immersing the substrate 11 in a developer such as an organic solvent or an alkaline solution that dissolves the photoresist 15P, and then removing the photoresist 15P having dissolved to the developer by rinsing the substrate 11 with a rinsing liquid such as pure water. This results in the remaining photoresist 15P having portions that extend along the Y-axis direction in FIG. 2 while covering end portions of the hole injection layers 13 and that are spaced away from one another in the X-axis direction in FIG. 2.

d. Supplementary Exposure

Subsequently, supplementary exposure of the photoresist 15P is performed. At this point, the photoresist 15P has apertures formed in portions thereof, due to the completion of the developing. The supplementary exposure is performed, for example, by placing a photomask 52 that is light-transmissive at all areas thereof above the substrate 11, and exposing the substrate 11 to light L0 from over the photomask 52.

The supplementary exposure is performed so that the incompletely-exposed areas 15Pb receive light L0 having sufficient intensity. Thus, upon completion of the supplementary exposure, the photoresist 15P remaining on the substrate 11 is composed of only exposed areas 15Pa. Further, a suitable exposure amount of light L0 in the supplementary exposure is to be selected depending upon the photoresist 15P that is used. For example, the exposure amount may be set within a range from 50 mJ/cm$^2$ to 500 mJ/cm$^2$.

Here, it should be noted that using a photomask that is light-transmissive at all areas thereof in the supplementary exposure enables performing the masked exposure and the supplementary exposure under the same exposure conditions. Thus, the use of such a photomask in the supplementary exposure has advantageous effects such as transforming the incompletely-exposed areas 15Pb into stable exposed areas 15Pa and simplifying the manufacture process. Specifically, the exposure amount of the photoresist 15P with respect to the amount of light L0 radiated is set to be the same in the masked exposure and the supplementary exposure. This enables precise adjustment of the exposure amount of the photoresist 15P through the supplementary exposure, and thus, enables transforming the incompletely-exposed areas 15Pb into the stable exposed areas 15Pa. In addition, this enables performing the masked exposure and the supplementary exposure by using the same manufacturing line (i.e., the same exposure device), and thus achieves rationalization and simplification of the manufacturing process. However, the use of the photomask 52 in the supplementary exposure is not essential, and the supplementary exposure may be performed by directly exposing the photoresist to light L0 without using the photomask 52.

Further, as described above, the supplementary exposure is performed at an exposure amount sufficient for increasing the stiffness of the semi-exposed areas 15Pb, and thus, the exposure amount in the supplementary exposure is not as great as that in the exposure to UV radiation described in the following. That is, decomposition and removal of the photoresist 15P barely occurs in the supplementary exposure.

e. Baking

Figure 8A:
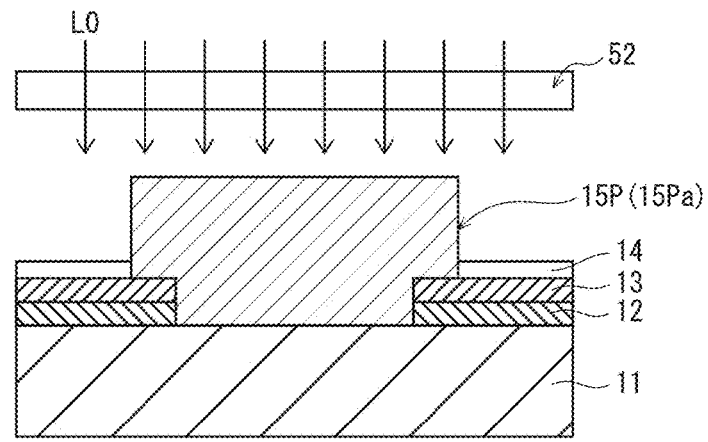
FIGS. 8A through 8C are schematic cross-sectional views illustrating procedures in the forming of the bank layer of the organic EL display panel 10, with FIG. 8A illustrating supplementary photoresist exposure, FIG. 8B illustrating baking, and FIG. 8C illustrating exposure to ultraviolet (UV) radiation.
Figure 8B:
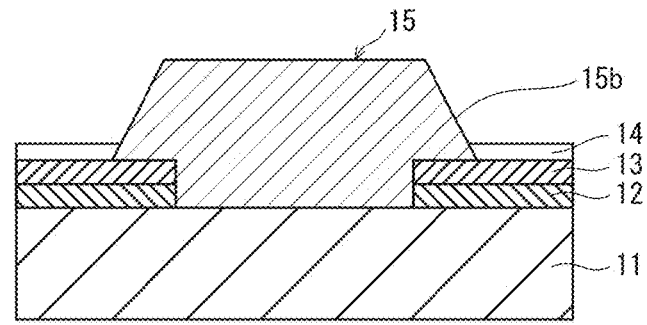

Subsequently, baking of the photoresist 15P is performed as illustrated in FIG. 8B. Specifically, the photoresist 15P having undergone the supplementary exposure is heated by using a device such as a hot plate, a hot air drying oven, or an infrared lamp. Here, the baking temperature and the baking duration are set according to the photoresist 15P that is used. For example, the baking temperature may be within a range from 150 degrees Celsius to 250 degrees Celsius, and the baking duration may be within a range from 30 minutes to 120 minutes.

The baking strengthens the adhesion between the photoresist 15P and layers therebelow, such as the substrate 11. The baking also increases the density of the photoresist 15P. Due to this, the baking provides the bank layer 15 with high tensile strength and high organic solvent resistance. In particular, when the photoresist 15P contains a liquid repellent component, the baking causes the liquid repellent component to move towards a surface of the photoresist 15P, which results in the bank layer 15 that is produced having high liquid repellency. In addition, the baking removes residue still remaining on the substrate 11 after the developing, such as unnecessary photoresist 15P and developer residue. Thus, the baking increases the wettability inside the apertures 15a.

Here, upon the baking, the photoresist 15P is composed of only exposed areas 15Pa due to the supplementary exposure performed before the baking. Thus, the flow of the photoresist 15P towards the inside of the apertures during the baking is suppressed. That is, the above-described method suppresses heat-caused loosening, and thus produces the bank layer 15 having slope portions 15b with great inclination angles.

f. Exposure to UV Radiation

Figure 8C:
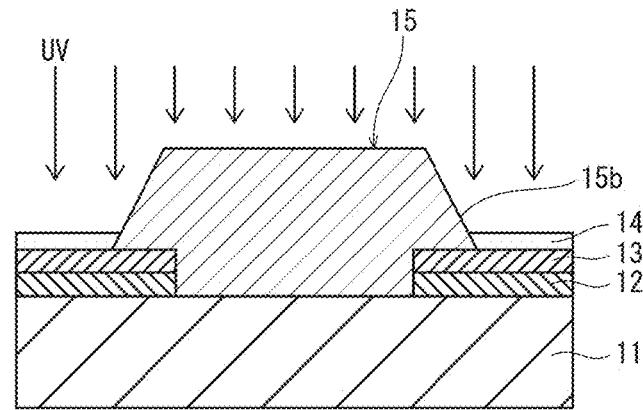

Subsequently, the top side of the baked substrate 11 is exposed to UV radiation, as illustrated in FIG. 8C. The exposure to UV radiation causes the slope portions 15b to under decomposition and removal to some extent, and thus increases the aperture ratio of the panel 10 and increases the wettability inside the apertures 15a. In particular, when the bank layer 15 contains a liquid repellent component, the exposure to UV radiation is performed such that the liquid repellent component having moved to the surfaces of the slope portions 15b is removed, and thus the liquid repellency of the slope portions 15b is reduced. Thus, the exposure to UV radiation increases the wettability of peripheral edge portions of the apertures 15a. Further, the exposure to UV radiation also decomposes and removes residue still remaining on the substrate 11 after processing such as the developing and the baking, such as unnecessary photoresist 15P and developer residue. Thus, the baking increases the wettability inside the apertures 15a The manufacturing method described above suppresses heat-caused loosening during the forming of the bank layer 15. This means that causes of decrease in wettability inside the apertures 15a, such as slope portions with small inclination angles and residue inside the apertures 15a, are not likely to be generated in this manufacturing method. Thus, this manufacturing method ensures a desirable level of wettability inside the apertures without relying upon exposure to excessive UV radiation. Thus, the manufacturing method reduces the risk of ink containing functional material flowing over the bank layer 15 to adjacent apertures 15a as a result of an excessive decrease in film thickness, liquid repellency, and the like of the bank layer 15.

Further, it should be noted that the exposure to UV radiation is not essential to the manufacturing method described above, since a desirable level of wettability inside the apertures 15a may be ensured under certain conditions, without performing the exposure to UV radiation after the baking. That is, in the manufacturing method described above, the exposure amount in the exposure to UV radiation can be optimized according to manufacturing conditions such as: the physical property of the bank layer 15 and the physical property of ink; the size of the apertures 15a; and the number of times ink application is performed per aperture 15a, and under certain manufacturing conditions, the exposure to UV radiation may not be performed. Note that when performing the exposure to UV radiation, the exposure amount may for example be set within a range from 1000 $mJ/cm^2$ to 10000 $mJ/cm^2$. Further, when performing the exposure to UV radiation after the baking, it is preferable that the entire substrate 11 be baked once again after the exposure to UV radiation. This additional baking achieves stabilizing the surfaces of the bank layer 15 and the like, which has undergone some decomposition in the exposure to UV radiation. Further, this additional baking also achieves removing residue such as residue of the bank layer 15, which is generated through the bank layer 15 having undergone some decomposition in the exposure to UV radiation.

Forming the bank layer 15 as described above suppresses heat-caused loosening during the forming of the bank layer 15, and produces the bank layer 15 with slope portions 15b having great inclination angles. This suppresses a decrease in aperture ratio of the panel 10, and also suppresses the occurrence of problems in the hole transport layers 16A and the organic light-emitting layers 16B such as unevenness in film thickness and undesirable shape.

4 Implementation Samples

The following describes a result of an observation performed to confirm the effects of the manufacturing method described above. The observation was conducted by actually preparing samples of the panel 10 according to the manufacturing method described above (referred to in the following as implementation samples). Note that different implementation samples of the panel 10 were prepared by changing the exposure amount in the supplementary exposure. Specifically, implementation samples 1, 2, 3, and 4 were prepared, respectively corresponding to exposure amounts 50 $mJ/cm^2$, 100 $mJ/cm^2$, 200 $mJ/cm^2$, and 500 $mJ/cm^2$ in the supplementary exposure. Further, another sample was prepared without performing the supplementary exposure, and this sample (referred to in the following as a comparative sample) was used for comparison with the implementation samples. Note that the manufacturing of this comparative sample was performed under the same conditions (e.g., the same material and the same manufacturing procedures) as implementation samples 1 through 4, other than the exclusion of the supplementary exposure.

Figure 9:
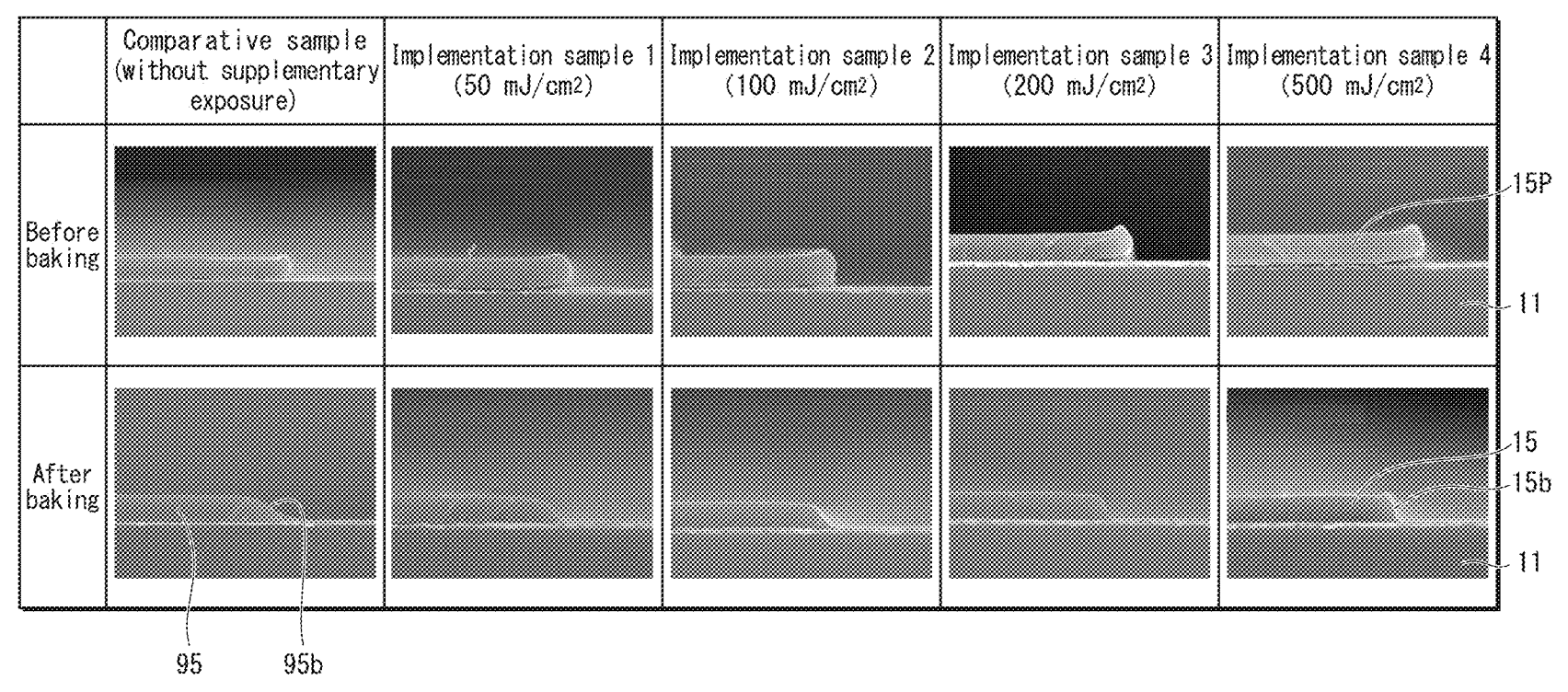

FIG. 9 shows cross-sectional photographs illustrating change in bank layer shape before and after baking. The photographs correspond to different exposure amounts in the supplementary exposure. Note that the cross-sectional photographs in the upper tier in FIG. 9 each show, for one of the samples, the shape of the photoresist 15P on the substrate 11 before the baking. Meanwhile, the cross-sectional photographs in the lower tier in FIG. 9 each show, for one of the samples, the shape of the bank layer on the substrate 11 after the baking. Note that each of the implementation samples 1 through 4 includes the bank layer 15, whereas the comparative sample includes the bank layer 95.

From these photographs, it can be seen that the bank layer 95 in the comparative sample after baking has slope portions 95b with small inclination angles. Meanwhile, it can be seen that the bank layer 15 in each of the implementation samples 1 through 4 after baking has slope portions 15b with great inclination angles. This shows that heat-caused loosening having occurred in the preparation of implementation samples 1 through 4 was smaller than that having occurred in the preparation of the comparative sample. This means that the panel manufacturing method pertaining to one aspect of the present invention suppresses heat-caused loosening occurring during the forming of the bank layer 15 in the panel 10. Further, FIG. 9 also shows that the inclination angle changes in proportion to the exposure amount in the supplementary exposure, or more specifically, the greater the exposure amount in the supplementary exposure, the greater the effect of suppressing the heat-caused loosening.

Further, another observation was conducted to confirm the effect achieved by suppressing heat-caused loosening, by using implementation sample 2 and the comparative sample described above. FIGS. 10 and 11 show plan-view photographs of surfaces having different levels of ink wettability. Each of the plan-view photographs shows a state when a drop of an ink containing functional material is applied to a center of a specific area in an aperture (aperture 15a in bank layer 15, aperture 95a in bank layer 95). The specific area is shown in black at the center of each photograph in FIGS. 10 and 11, and is an area that is between portions of the pixel defining layer 14 (shown in grey in FIGS. 10 and 11) and that is above a combination of a first electrode 12 and a hole injection layer 13. Note that each of FIGS. 10 and 11 illustrate, for each of implementation sample 2 and the comparative sample, three samples 21 through 23 prepared by varying the duration of the exposure to UV radiation, which is performed after baking, among 0 seconds, 120 seconds, and 220 seconds. Note that samples 21 through 23 of sample 2 are referred to as implementation samples 21 through 23 in the following, and samples 21 through 23 of the comparative examples are referred to as comparative samples 21 through 23 in the following. Further, the samples illustrated in FIG. 10 and the samples illustrated in FIG. 11 differ in terms of the material of the bank layer (bank layer 15, bank layer 95). Specifically, FIG. 11 shows samples prepared by using bank layer material having higher liquid repellency than the bank layer material used for preparing the samples shown in FIG. 10. Further, the white portions seen in some of the center black areas in FIGS. 10 and 11 indicate areas of ink unevenness.

FIG. 10 shows that in each of implementation samples 21 through 23, the ink has spread uniformly over the entire center black area, regardless of whether or not exposure to UV radiation has been performed and the duration of the exposure to UV radiation. Meanwhile, in comparative sample 21, a white portion having a substantially rectangular frame like shape can be seen in the black area of the aperture 95a. This shows that in comparative sample 21, ink has not flowed beyond the white portion, and thus, ink unwetting has occurred around the bank layer 95. In comparative sample 22, a white portion can be seen in the bottom portion of the black area of the aperture 95a. This shows that in comparative sample 22, ink has not flowed sufficiently to the bottom portion of the black area, and thus, ink unwetting has occurred around a portion of the bank layer 95 that is located at the bottom of the photograph.

As such, it can be seen that the implementation samples 21 through 23, which have the slope portions 15b with great inclination angles, have greater ink wettability compared to the comparative samples 21 through 23, which have the slope portions 95b with small inclination angles. Thus, it is less likely for hole transport layers 16A and organic light-emitting layers 16B having problems such as unevenness in film thickness and undesirable shape to be formed in the implementation samples than in the comparative samples. Here, it should be noted that while ink has spread uniformly in the aperture 95a in comparative sample 23, comparative sample 23 was prepared by performing exposure to UV radiation for a long amount of time. As described above, exposure to excessive UV radiation results in an excessive decrease of liquid repellency of the bank layer 95, and thus, in the comparative sample 23, there is a risk of ink flowing over the bank layer 95 to adjacent apertures 95a. Accordingly, the manufacturing method pertaining to one aspect of the present invention, which allows selecting the UV radiation amount and duration from a wide range to produce satisfactory devices such as implementation examples 21 through 23, is beneficial.

Meanwhile, FIG. 11 shows that ink has uniformly spread over the black area in the aperture 15a in implementation samples 25 and 26. However, ink did not spread uniformly in such a manner in implementation example 24, which was prepared without performing exposure to UV radiation. Further, a white portion can be seen in the black area in the aperture 95a in each of comparative samples 24 through 26, regardless of whether or not exposure to UV radiation has been performed and the duration for which the exposure to UV radiation has been performed in the preparation of the samples. This means that ink unwetting has occurred in the comparative samples due to insufficient spread of ink in the black area of the aperture 95a.

FIG. 11 shows that even if bank layer material with increased liquid repellency is used, suppressing heat-caused loosening has the effect of improving wettabilty. Further, while unwetting has occurred in implementation sample 24, unwetting around the bank layer 15 can be suppressed by applying a greater number of ink droplets. Meanwhile, suppressing unwetting occurring with apertures 95a having low wettability, such as those in comparative samples 24 through 26, requires applying ink near the bank layer 95, which leads to a risk of outflow of ink to adjacent apertures 95a.

5. Supplement (1) Plan-View Shape of Bank Layer 15 (Pixel Bank Structure)

Figure 12:
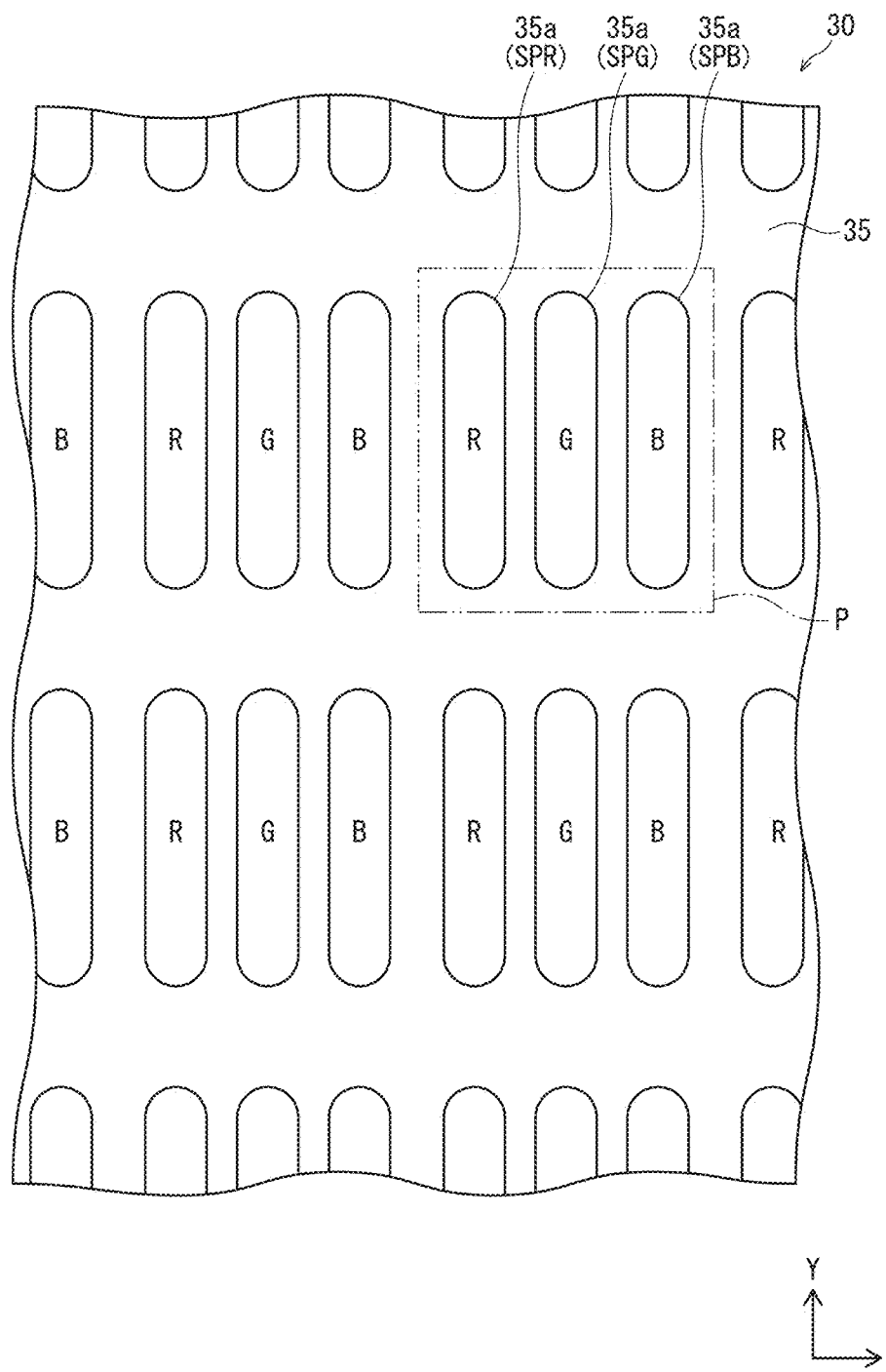
FIG. 12 is a schematic plan view showing a portion of an image display face of an organic EL display panel 30 in enlarged state.

In the panel 10, the bank layer 15 in plan view has the line bank structure. However, the organic EL display panel manufacturing method pertaining to one aspect of the present invention achieves the effects described above even with a bank layer having the pixel bank structure in plan view. FIG. 12 is a schematic plan view showing a portion of an image display face of an organic EL display panel 30 in enlarged state. The organic EL display panel 30 (referred to as panel 30 in the following) has the pixel bank structure, and includes a bank layer 35 instead of the combination of the pixel defining layer 14 and the bank layer 15 in the panel 10. Note that the panel 30 has a structure similar to the panel 10 with the exception of the bank layer 35, and thus, components of the panel 30 that are also included in the panel 10 are indicated by the same reference signs, and description thereof is not provided in the following.

The bank layer 35 is similar to the bank layer 15 in terms of material but differs from the bank layer 15 in terms of shape. Specifically, the bank layer 35 defines openings 35a, in each of which only one sub-pixel (sub-pixel SPR, sub-pixel SPG, or sub-pixel SPB) is disposed. That is, the bank layer 35 has a lattice shape, and partitions the combination of a hole transport layer 16A and an organic light-emitting layer 16B for one organic EL element from the combination of a hole transport layer 16A and an organic light-emitting layer 16B for another organic EL element.

Such a bank layer 35 can be formed, for example, by making a modification to the method of forming the bank layer 15 by changing the pattern of the photomask used in the masked exposure. For example, when using a negative photoresist, the bank layer 35 can be formed by performing masked exposure by using a photomask such that (i) when the photomask is placed above the substrate, light blocking portions of the photomask are located above the areas where the sub-pixels SPR, SPG, SPB are to be formed, and (ii) the photomask has a lattice shape formed by the light blocking portions being partitioned from one another by light transmitting portions.

Further, by performing the supplementary exposure between the developing and the baking, heat-caused loosening can be suppressed in the forming of the bank layer 35, similar to the forming of the bank layer 15. This results in the bank layer 35 being formed with slope portions having great inclination angles. This further results in suppressing the decrease in aperture ratio of the panel 30, similar to the decrease in aperture ratio of the panel 10, and also reduces the risk of functional layers (e.g., the hole transport layers 16A and the organic light-emitting layers 16B) having problems such as unevenness in film thickness and undesirable shape.

(2) Other Matters

In the panel 10, the pixel defining layer 14 has portions extending in the X-axis direction in FIG. 2, and the bank layer 15 has portions extending in the Y-axis direction in FIG. 2. However, the pixel defining layer and the bank layer may have shapes other than these respective shapes. Specifically, as long as portions of the pixel defining layer and portions of the bank layer intersect with one another, the angle of intersection need not be 90°. Further, the portions of the pixel defining layer and the portions of the bank layer need not extend in parallel with edges of the image forming face of the panel 10 (i.e., the X-axis direction and the Y-axis direction in FIG. 2). That is, the portions of the pixel defining layer and/or the portions of the bank layer may extend in a direction that is not parallel to any edge of the image display face.

Further, the pixel defining layer 14 in the panel 10 has portions that extend in the X-axis direction and that are spaced away from one another in the Y-axis direction. However, the pixel defining layer need not have such a shape. For example, the pixel defining layer may have a shape similar to the bank layer 35 and have a lattice shape with apertures corresponding one-to-one with the first electrodes 12. When making this modification, the pixel defining layer is also present around bottom portions of the bank layer 15 adjacent to the sub-pixels SPR, SPG, and SPB, and would improve ink wettability of such portions. However, it should be noted that a pixel defining layer with portions extending in the same direction (e.g., the pixel defining layer 14) is advantageous for improving the aperture ratio of the panel 10 and the flatness inside the apertures 15a.

Further, in the forming of the bank layer (the bank layer 15 in the panel 10 and the bank layer 35 in the panel 30), the surface treatment for providing the photoresist with liquid repellency may be performed after the baking or after the exposure to UV radiation. This is since, due to heat-caused loosening being suppressed in the forming of the bank layer (the bank layer 15 in the panel 10 and the bank layer 35 in the panel 30) and thus the bank layer has slope portions with great inclination angles, providing the bank layer with liquid repellency does not much affect the wettability of the apertures 15a (refer to FIG. 11).

In the panels 10 and 30, functional layers are formed through performing a wet process with respect to each aperture (aperture 15a in the panel 10 and aperture 35a in the panel 30), i.e., applying inks containing functional materials and drying the inks. Specifically, in the panels 10 and 30, the hole transport layers 16A and the organic light-emitting layers 16B are formed through the wet process. However, other functional layers may be formed through a wet process. As long as at least one type of functional layer is formed inside apertures defined by a bank layer through a wet process, any type of functional layer may be formed, including the following examples: organic light-emitting layers; hole injection layers; electron injection layers; hole transport layer; electron transport layers; hole blocking layers; electron blocking layers; and buffer layers. Further, each sub-pixel may include one type of functional layer formed through a wet process, or three or more types of functional layers formed through a wet process. For example, each sub-pixel may include one of the hole transport layer 16A and the organic light-emitting layer 16B as a functional layer formed by using a wet process, and the other one of the hole transport layer 16A and the organic light-emitting layer 16B may be formed through a dry process. When making this modification, the type of functional layer(s) formed through a dry process may have any shape. For example, the type of functional layer(s) formed through a dry process may be formed in plurality for each sub-pixel or for each aperture in the bank layer, or may be formed in plurality to be shared by a plurality of sub-pixels or a plurality of apertures in the bank layer. Further, one functional layer formed through a dry process may cover all the apertures in the bank layer. Further, a modification may be made such that each sub-pixel includes only the organic light-emitting layer 16B as the type of functional layer formed through the wet process, and does not include the hole transport layer 16A. Further, for example, the hole injection layers 13 and/or the electron transport layer 17 in each aperture (aperture 15a, aperture 35a) may be formed through a wet process.

The panels 10 and 30 have rectangular image display faces. However, the image display face may have any shape, and for example, may have a polygonal shape such as a triangular shape, a square shape, or a pentagonal shape, a circular shape, or an elliptical shape, or may be a combination of one or more of such shapes. Further, the image display region (region within which sub-pixels SPR, SPG, SPB are formed) of the image display face may have the same shape as the image display face, or may have a shape differing from the image display face. For example, the image display face may be rectangular and the image display region may be elliptical.

In the panels 10 and 30, sub-pixels (sub-pixels SPR, SPG, SPB) are arrayed in a direction parallel to the lengthwise direction of the image display face and in a direction parallel to the widthwise direction of the image display face, as illustrated in FIGS. 1 and 2. However, the sub-pixels may be disposed in any arrangement, and for example, may be arranged in a staggered pattern.

Further, the panels 10 and 30 include sub-pixels SPR, sub-pixels SPG, and sub-pixels SPB, respectively emitting red light, green light, and blue light. However, the sub-pixels may have any light-emission color(s), and for example, only sub-pixels whose light-emission color is red may be provided, or sub-pixels of the four light-emission colors of red, green, blue, and yellow may be provided. Further, each pixel P need not included one sub-pixel per light-emission color, and may include two or more sub-pixels per light-emission colors. Further, the order in which sub-pixels in each pixel P is arranged need not be the order illustrated in FIGS. 2 and 14, i.e., the order of red, green, and blue, and sub-pixels in each pixel P may be arranged in any order. Further, in the panels 10 and 30, each pixel P is composed of sub-pixels arranged next to one another in the X-axis direction. However, the arrangement of sub-pixels composing each pixel is not limited to this, and each pixel P may be composed of sub-pixels arranged next to one another in the Y-direction, or may be composed of three sub-pixels arranged at the three vertices of a triangle.

In the panels 10 and 30, the first electrodes 12 serve as anodes and the second electrode 18 serves as a cathode. Alternatively, an inverse structure may be adopted in which the first electrodes 12 serve as cathodes and the second electrode 18 serves as an anode.

Further, in the panels 10 and 30, the bank layer (bank layer 15 in the panel 10 and bank layer 35 in the panel 30) only has apertures defining areas where organic light-emitting elements are to be disposed (apertures 15a in the bank layer 15 and apertures 35a in the bank layer 35). However, the bank layer may additionally have one or more openings where one or more bus-bars (auxiliary electrodes) are to be disposed. Typically, a bus-bar reduces the influence of voltage drop occurring due to resistance of the second electrode 18.

In the above, the panels 10 and 30 are top-emission-type organic EL display panels using the active matrix scheme. Alternatively, for example, the panels 10 and 30 may be bottom-emission-type organic EL display panels and/or may use the passive matrix scheme.

When making any modification above, the structure and the manufacturing method of the panels 10 and 30 are to be changed accordingly as necessary.

INDUSTRIAL APPLICABILITY

The organic EL display panel manufacturing method pertaining to the present invention is widely applicable as a manufacturing method of display panels usable in various electronic devices, such as televisions, personal computers, portable terminals, and commercial displays.

REFERENCE SIGNS LIST 10, 30 Organic EL display panel
11 Substrate
12 First electrode
15, 35, 95 Bank layer
15a, 35a, 95a Aperture
15P, 15Px Photoresist
16A Hole transport layer (functional layer)
16B Organic light-emitting layer (functional layer)
16a Ink
18 Second electrode
51, 52, 61 Photomask
UV Ultraviolet

The invention claimed is:

1. A manufacturing method of an organic electroluminescence (EL) display panel, comprising:
preparing a substrate;
forming at least first electrodes on the substrate;
forming, by performing photolithography on the substrate having the first electrodes formed thereon, a bank layer that is made of a photoresist and that has apertures corresponding one-to-one with the first electrodes;
forming a functional layer in each of the apertures by applying an ink containing a functional material to the aperture and drying the applied ink; and
forming at least a second electrode on the functional layer, wherein
the forming of the bank layer comprises:
applying the photoresist to the substrate having the first electrodes formed thereon:
forming apertures corresponding one-to-one with the first electrodes in the photoresist by performing exposure of the photoresist using a mask and then developing the photoresist;
after forming the apertures in the photoresist, performing exposure of the photoresist having the apertures formed therein;
after performing the exposure of the photoresist having the apertures formed therein, performing baking of the photoresist, wherein
the forming of the bank layer further comprises
after baking of the photoresist, exposing a top side of the substrate to ultraviolet radiation.

2. A manufacturing method of an organic electroluminescence (EL) display panel, comprising:
preparing a substrate;
forming at least first electrodes on the substrate;
forming, by performing photolithography on the substrate having the first electrodes formed thereon, a bank layer that is made of a photoresist and that has apertures corresponding one-to-one with the first electrodes;
forming a functional layer in each of the apertures by applying an ink containing a functional material to the aperture and drying the applied ink; and
forming at least a second electrode on the functional layer, wherein
the forming of the bank layer comprises:
applying the photoresist to the substrate having the first electrodes formed thereon;
forming apertures corresponding one-to-one with the first electrodes in the photoresist by performing exposure of the photoresist using a mask and then developing the photoresist;
after forming the apertures in the photoresist, performing exposure of the photoresist having the apertures formed therein;
after performing the exposure of the photoresist having the apertures formed therein, performing baking of the photoresist, wherein the forming of the apertures comprises performing a first exposure of the photoresist, and the performing of the exposure of the photoresist having the apertures formed therein comprises performing a second exposure of the photoresist different from the first exposure of the photoresist.

3. A manufacturing method of an organic electroluminescence (EL) display panel, comprising:
preparing a substrate;
forming at least first electrodes on the substrate;
forming, by performing photolithography on the substrate having the first electrodes formed thereon, a bank layer that is made of a photoresist and that has apertures corresponding one-to-one with the first electrodes;
forming a functional layer in each of the apertures by applying an ink containing a functional material to the aperture and drying the applied ink; and
forming at least a second electrode on the functional layer, wherein
the forming of the bank layer comprises:
applying the photoresist to the substrate having the first electrodes formed thereon:
forming apertures corresponding one-to-one with the first electrodes in the photoresist by performing exposure of the photoresist using a mask and then developing the photoresist;

after forming the apertures in the photoresist, performing exposure of the photoresist having the apertures formed therein;

after performing the exposure of the photoresist having the apertures formed therein, performing baking of the photoresist, wherein the performing of the exposure of the photoresist having the apertures formed therein comprises performing the exposure of photoresist across an entirety of the substrate.

4. A manufacturing method of an organic electroluminescence (EL) display panel, comprising:

preparing a substrate;

forming at least first electrodes on the substrate;

forming, by performing photolithography on the substrate having the first electrodes formed thereon, a bank layer that is made of a photoresist and that has apertures corresponding one-to-one with the first electrodes;

forming a functional layer in each of the apertures by applying an ink containing a functional material to the aperture and drying the applied ink; and forming at least a second electrode on the functional layer, wherein the forming of the bank layer comprises:

applying the photoresist to the substrate having the first electrodes formed thereon:

forming apertures corresponding one-to-one with the first electrodes in the photoresist by performing exposure of the photoresist using a mask and then developing the photoresist;

after forming the apertures in the photoresist, performing exposure of the photoresist having the apertures formed therein;

after performing the exposure of the photoresist having the apertures formed therein, performing baking of the photoresist, wherein the forming of the apertures comprises performing a first exposure of the photoresist using a first mask, and the performing of the exposure of the photoresist having the apertures formed therein comprises performing a second exposure of the photoresist using a second mask different from the first mask.

\* \* \* \* \*